United States Patent
Mauder et al.

(10) Patent No.: US 9,171,728 B2
(45) Date of Patent: Oct. 27, 2015

(54) METHOD FOR FORMING A POWER SEMICONDUCTOR DEVICE

(71) Applicant: Infineon Technologies Austria AG, Villach (AT)

(72) Inventors: Anton Mauder, Kolbermoor (DE); Hans-Joachim Schulze, Taufkirchen (DE); Franz Hirler, Isen (DE); Wolfgang Lehnert, Lintach (DE); Rudolf Berger, Regensburg (DE); Klemens Pruegl, Regensburg (DE); Helmut Strack, Munich (DE)

(73) Assignee: Infineon Technologies Austria AG, Villach (AT)

( * ) Notice: Subject to any disclaimer, the term of this patent is extended or adjusted under 35 U.S.C. 154(b) by 3 days.

(21) Appl. No.: 14/260,352

(22) Filed: Apr. 24, 2014

(65) Prior Publication Data

US 2014/0235058 A1 Aug. 21, 2014

Related U.S. Application Data

(60) Division of application No. 13/542,737, filed on Jul. 6, 2012, now Pat. No. 8,786,012, which is a continuation-in-part of application No. 12/843,326, filed on Jul. 26, 2010, now Pat. No. 8,614,478.

(51) Int. Cl.
*H01L 29/66* (2006.01)
*H01L 21/28* (2006.01)
*H01L 29/423* (2006.01)
(Continued)

(52) U.S. Cl.
CPC ...... *H01L 21/28194* (2013.01); *H01L 21/0228* (2013.01); *H01L 21/02109* (2013.01); *H01L 21/02145* (2013.01); *H01L 29/408* (2013.01); *H01L 29/4236* (2013.01); *H01L 29/51* (2013.01); *H01L 29/513* (2013.01); *H01L 29/66734* (2013.01); *H01L 29/7393* (2013.01); *H01L 29/7394* (2013.01);
(Continued)

(58) Field of Classification Search
CPC ............ H01L 27/11563; H01L 29/4234
USPC .......... 438/268; 257/328, 546, E29.006, 257/E21.41
See application file for complete search history.

(56) References Cited

U.S. PATENT DOCUMENTS 3,500,142 A 3/1970 Kahng
4,173,766 A 11/1979 Hayes
(Continued)

FOREIGN PATENT DOCUMENTS

EP 1649501 B1 4/2006

OTHER PUBLICATIONS

Hoex, et al., "Crystalline Silicon Surface Passivation by the Negative-Charge-Dielectric Al2O3", 33rd Photovoltaic Specialists Conference. IEEE, May 2008. pp. 1-4.
(Continued)

*Primary Examiner* — Elias M Ullah
(74) *Attorney, Agent, or Firm* — Murphy, Bilak & Homiller, PLLC

(57) ABSTRACT

A method for forming a semiconductor device includes providing a semiconductor body which has a main surface and a first n-type semiconductor region, forming a trench which extends from the main surface into the first n-type semiconductor region, and forming a dielectric layer having fixed negative charges on a surface of the trench, by performing at least one atomic layer deposition using an organometallic precursor.

10 Claims, 40 Drawing Sheets

(51) Int. Cl.

| | | |
|---|---|---|
| H01L 29/51 | (2006.01) | |
| H01L 29/739 | (2006.01) | |
| H01L 29/78 | (2006.01) | |
| H01L 29/792 | (2006.01) | |
| H01L 29/861 | (2006.01) | |
| H01L 21/02 | (2006.01) | |
| H01L 29/06 | (2006.01) | |
| H01L 29/16 | (2006.01) | |
| H01L 29/20 | (2006.01) | |
| H01L 29/40 | (2006.01) | |
| H01L 29/417 | (2006.01) | |

(52) U.S. Cl.
CPC ....... *H01L 29/7397* (2013.01); *H01L 29/7803* (2013.01); *H01L 29/7811* (2013.01); *H01L 29/7813* (2013.01); *H01L 29/7835* (2013.01); *H01L 29/792* (2013.01); *H01L 29/8611* (2013.01); *H01L 29/0653* (2013.01); *H01L 29/1608* (2013.01); *H01L 29/2003* (2013.01); *H01L 29/402* (2013.01); *H01L 29/407* (2013.01); *H01L 29/41766* (2013.01); *H01L 29/42368* (2013.01)

(56) References Cited

U.S. PATENT DOCUMENTS

| | | |
|---|---|---|
| 6,445,054 B1 | 9/2002 | Traijkovic et al. |
| 6,849,890 B2 | 2/2005 | Kokubun |
| 2006/0138566 A1 | 6/2006 | Chakravarti et al. |
| 2007/0218654 A1 | 9/2007 | Spencer et al. |
| 2008/0164516 A1 | 7/2008 | Darwish |
| 2008/0166845 A1 | 7/2008 | Darwish |
| 2009/0039414 A1 | 2/2009 | Lue et al. |
| 2010/0084704 A1 | 4/2010 | Darwish et al. |

OTHER PUBLICATIONS

Ueda, et al., "Wide-Bandgap Semiconductor Devices for Automobile Applications." CS MANTECH Conference, Apr. 24-27, 2006. Vancouver, Canada. pp. 37-40.

Kalkofen, Bodo et al., "Atomic layer deposition of boron oxide as dopant source for shallow doping of silicon", The Electrochemical Society, 217th ECS Meeting, Abstract #943, Vancouver, Apr. 25-30, 2010.

METHOD FOR FORMING A POWER SEMICONDUCTOR DEVICE

CROSS-REFERENCE TO RELATED APPLICATIONS

The present application is a Divisional of U.S. patent application Ser. No. 13/542,737, filed on Jul. 6, 2012, which in turn is a Continuation-In-Part of U.S. patent application Ser. No. 12/843,326, filed on Jul. 26, 2010, both of said applications incorporated herein by reference in their entirety.

FIELD OF THE INVENTION

This specification refers to embodiments of methods for protecting a semiconductor device against hot charge carrier induced degradation. Furthermore, this specification refers to embodiments of semiconductor devices, in particular to field effect power semiconductor devices, which are protected against the injection of hot charge carriers into a dielectric region, and a manufacturing method therefor.

BACKGROUND

Many functions of modern devices in automotive, consumer and industrial applications such as converting electrical energy and driving an electric motor or an electric machine rely on semiconductor devices. It is often desirable that the semiconductor devices operate reliably over a long period. A long term high reliability of semiconductor devices is also often expected in consumer electronics, for example in high fidelity audio amplifier circuits. The characteristics of power semiconductor devices such as power transistors used in the amplifier circuit affect the performance of the circuit. It is therefore often desired to prevent or at least delay any degradation of the characteristics such as threshold voltage, blocking voltage, switching time, switching characteristics or amplification.

In particular power semiconductor devices are typically exposed to high loads during operation. For example, a power semiconductor device such as a power IGBT (Insulated Gate Bipolar Transistor) operating in a power converter or as a driver or switch of an electric motor may be exposed to high currents while sweeping-out the excess charge and/or voltages during switching or an operating cycle. In such an event, hot charge carriers, typically hot electrons may be generated in high electric field regions. However, when the hot carriers are injected into a dielectric layer or a field dielectric of the IGBT, degradation of transistor characteristics and even complete device failure may occur.

These effects can also occur outside the active area of power semiconductor devices. Hot carrier injection has also been found to be a reliability risk for edge termination structures in power semiconductor devices. The observed drift of the blocking capability has been attributed to hot electrons which are injected into the dielectric region of edge termination field plates. As the likelihood of hot carrier induced degradation or deterioration of device properties increases with decreasing device dimension, hot-electron-induced degradation is also known to impose limits on the scaling of dielectrics.

In addition, hot-electron-induced degradation of semiconductor devices can often only be detected in sophisticated long-term reliability tests such as high temperature reverse bias tests.

With appropriately poled field plates and/or doped regions the field strength close to the dielectric regions may be reduced. These measures are however not always feasible and impose design restrictions. For example, using an additional n-doped semiconductor region below a p-doped body region of a MOSFET (Metal-Oxide Semiconductor Field-Effect Transistor) or IGBT results in a reduced blocking voltage.

For these and other reasons there is a need for the present invention.

SUMMARY

According to an embodiment, a method for protecting a semiconductor device against degradation of its electrical characteristics is provided. The method includes providing a semiconductor device having a first semiconductor region and a charged dielectric layer which form a dielectric-semiconductor interface. The majority charge carriers of the first semiconductor region are of a first charge type. The charged dielectric layer includes fixed charges of the first charge type. The charge carrier density per area of the fixed charges is configured such that the charged dielectric layer is shielded against incorporation of hot majority charge carriers generated in the first semiconductor region.

According to an embodiment, a semiconductor transistor having a semiconductor body is provided. The semiconductor body includes a dielectric region and a first semiconductor region with majority charge carriers of a first charge type. The dielectric region includes a first charged dielectric portion and a second charged dielectric portion with fixed charges of the first charge type. The first charged dielectric portion has a first maximum charge carrier density per area. The second charged dielectric portion has a second maximum charge carrier density per area of the fixed charges. The second maximum charge carrier density per area is larger than the first maximum charge carrier density per area. The first semiconductor region forms an insulator-semiconductor interface at least with the second charged dielectric portion.

According to an embodiment, a method for forming a semiconductor device is provided. The method includes providing a semiconductor body having a first semiconductor region. The majority charge carriers of the first semiconductor region are of a first charge type. The method further includes forming a dielectric region having fixed charges of the first charge type and forming an electrode structure next to the dielectric region, such that the electrode structure is insulated from the semiconductor body. The first semiconductor region forms a drift region. The electrode structure forms at least one of a field plate and a gate electrode having a portion which is arranged next to the dielectric region and configured to operate as a field plate. Forming the dielectric region includes forming a first dielectric layer on the first semiconductor region, forming a second layer on the first dielectric layer by atomic layer deposition (ALD), and forming a second dielectric layer on the second layer. The dielectric region is formed such that the dielectric region and the first semiconductor region form an insulator-semiconductor interface.

According to an embodiment, a method for protecting a semiconductor device from degradation of its electrical characteristics is provided. The method includes providing a semiconductor device having a first semiconductor region and a charged dielectric layer which form a dielectric-semiconductor interface. The majority charge carriers in the first semiconductor region are of a first charge type. The charged dielectric layer includes fixed charges of the first charge type. The method also comprises configuring a charge carrier density per area of the fixed charges prior to providing the semiconductor device such that the charged dielectric layer is shielded against incorporating hot majority charge carriers generated in the first semiconductor region.

According to an embodiment, a power semiconductor device having a semiconductor body is provided. The semiconductor body includes an active area and a peripheral area which both define a horizontal main surface of the semiconductor body. The semiconductor body further includes an n-type semiconductor layer, a pn junction and at least one trench. The n-type semiconductor layer is embedded in the semiconductor body and extends to the main surface in the peripheral area. The pn junction is arranged between the n-type semiconductor layer and the main surface in the active area. The at least one trench extends in the peripheral area from the main surface into the n-type semiconductor layer and comprises a dielectric layer with fixed negative charges. In the vertical direction, the dielectric layer is arranged both below and above the pn junction. The dielectric layer with fixed negative charges typically has a negative net charge.

According to an embodiment, a vertical semiconductor transistor having a semiconductor body is provided. The semiconductor body includes a first n-type semiconductor region, a second semiconductor region which forms a pn junction with the first semiconductor region, and a third semiconductor region. The semiconductor body further includes a dielectric layer which includes fixed negative charges at least in one portion, adjoins the second semiconductor region and is arranged between the first semiconductor region and the third semiconductor region. The vertical semiconductor transistor further includes an insulated gate electrode which is adjacent to the first semiconductor region and the second semiconductor region.

According to an embodiment, a method for forming a semiconductor device is provided. The method includes providing a semiconductor body which includes a first n-type semiconductor region. A trench is formed which extends from a main surface of the semiconductor body into the first semiconductor region. A dielectric layer with fixed negative charges is formed on a surface of the trench. Forming the dielectric layer includes performing at least one atomic layer deposition using an organometallic precursor.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
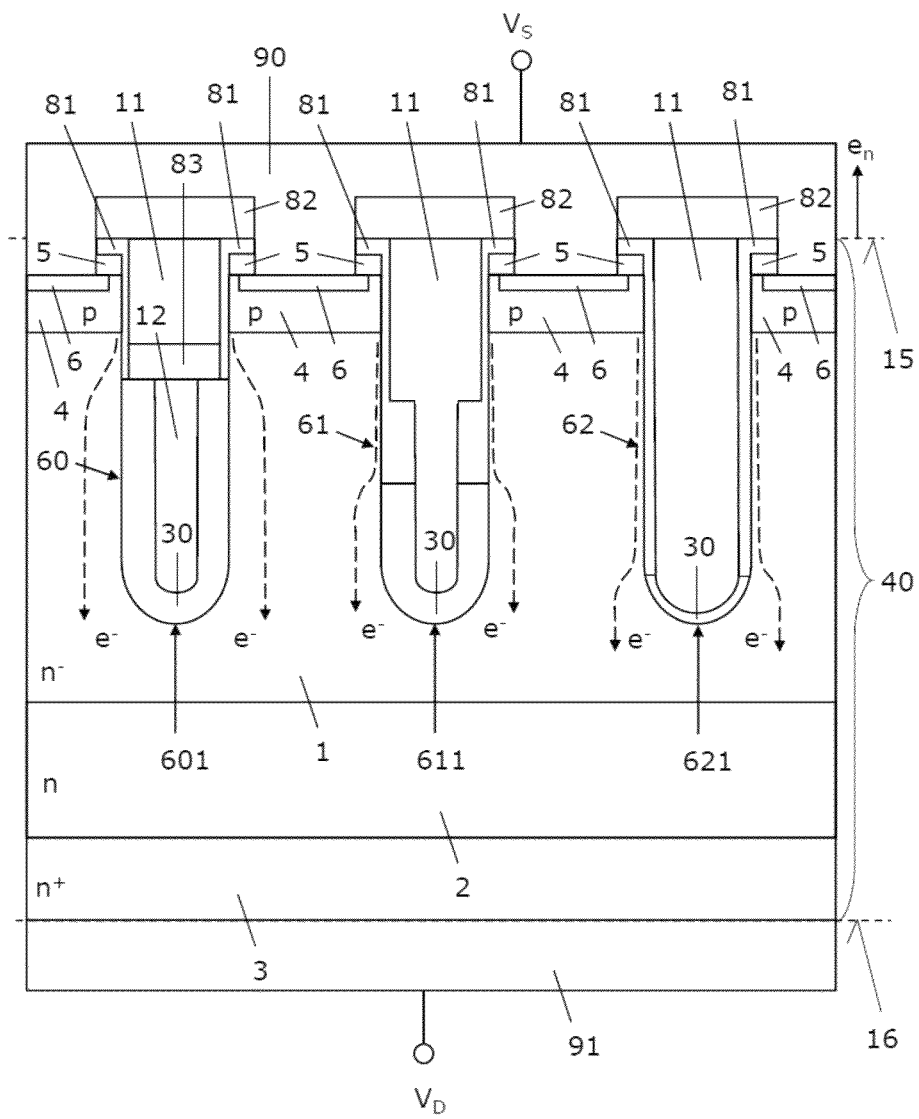
FIG. 1 schematically illustrates a vertical cross-section of a vertical semiconductor device according to one or more embodiments.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a chip.

The term "vertical" as used in this specification intends to describe an orientation which is arranged substantially perpendicular to the first surface, i.e. parallel to the normal direction of the first surface of the semiconductor substrate or body.

In this specification, n-doped is referred to as first conductivity type while p-doped is referred to as second conductivity type. The majority charge carriers of an n-doped region and a p-doped region are electrons and holes, respectively. In this specification, negative charge type is referred to as first charge type while positive charge type is referred to as second charge type. It goes without saying that the semiconductor devices can be formed with opposite doping relations so that the first conductivity type can be p-doped and the second conductivity type can be n-doped. Accordingly, the first charge type can also refer to the charge type of holes. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different n⁺ regions can have different absolute doping concentrations. The same applies, for example, to an n⁺ and a p⁺ region.

Specific embodiments described in this specification pertain to, without being limited thereto, field effect transistors, in particular to power field effect transistors. The term "field effect" as used in this specification intends to describe the electric field mediated forming of a conductive "channel" of a first conductivity type and/or control of conductivity and/or shape of the channel in a semiconductor region of a second conductivity type, typically a body region of the second conductivity type. Due to the field effect, a unipolar current path through the channel region between a source region of the first conductivity type in ohmic contact with a source electrode and a drain region of the first conductivity type, which is in ohmic contact with a drain electrode, is formed and/or controlled by the electric field. Without applying an external voltage between the gate electrode and the source electrode, the ohmic current path between the source electrode and the drain electrode through the semiconductor device is broken or at least high ohmic in normally-off field effect devices. In normally-on field effect devices such as HEMTs (High Electron Mobility Transistors) and normally-on JFETs (Junction-FETs), the current path between the source electrode and the drain electrode through the semiconductor device is typically low ohmic without applying an external voltage between the gate electrode and the source electrode.

In the context of the present specification, the term "field-effect structure" intends to describe a structure formed in a semiconductor substrate or semiconductor device having a gate electrode for forming and/or shaping a conductive channel in the channel region. The gate electrode is at least insulated from the channel region by a dielectric region or dielectric layer. In the context of the present specification, the term "field plate" intends to describe an electrode which is arranged next to a semiconductor region, typically a drift region, insulated from the semiconductor region, and configured to expand a depleted portion in the semiconductor region by applying an appropriate voltage, typically a positive voltage for an n-type drift region. The terms "depleted" and "completely depleted" intend to describe that a semiconductor region comprises substantially no free charge carriers. Typically, insulated field plates are arranged close to pn-junctions formed e.g. between a drift region and a body region. Accordingly, the blocking voltage of the pn-junction and the semiconductor device, respectively, may be increased. The dielectric layer or region which insulates the field plate from the drift region is in the following also referred to as a field dielectric layer or field dielectric region. The gate electrode and the field plate may be at the same electrical potential. Furthermore, a portion of the gate electrode may be operated as field electrode. Examples of dielectric materials for forming a dielectric region or dielectric layer between the gate electrode or a field plate and the drift region include, without being limited thereto, $SiO_2$, $Si_3N_4$, $SiO_xN_y$, $Al_2O_3$, $ZrO_2$, $Ta_2O_5$, $TiO_2$ and $HfO_2$. The term "power field effect transistor" as used in this specification intends to describe a field effect transistor on a single chip with high voltage and/or high current switching capabilities. In other words, power field effect transistors are intended for high current, typically in the Ampere range, and/or high voltages, typically above 20 V, more typically above 400V. The term "power field effect transistor" as used herein shall embrace both a unipolar power field effect transistor such as power MOSFETs and a bipolar power field effect transistor such as power IGBTs.

FIG. 1 illustrates an embodiment of a semiconductor device 100 in a section of a vertical cross-section. The semiconductor device 100 includes a semiconductor body 40 having a first or main surface 15 and a second surface 16 or lower surface 16 arranged opposite to the first surface 15. The normal direction $e_n$ of the first surface 15 is substantially parallel to, i.e. defines, the vertical direction.

In the following, embodiments pertaining to semiconductor devices and manufacturing methods therefor, respectively, are described mainly with reference to silicon (Si) semiconductor devices. Accordingly, a monocrystalline semiconductor region or layer is typically a monocrystalline Si-region or Si-layer. It should however be understood that the semiconductor body 40 can be made of any semiconductor material suitable for manufacturing a semiconductor device. Examples of such materials include, without being limited thereto, elementary semiconductor materials such as silicon (Si) or germanium (Ge) and mixed forms thereof ($Si_xGe_y$), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP) or indium gallium arsenide phosphide (InGaAsP), and binary or ternary II-VI semiconductor materials such as cadmium telluride (CdTe) and mercury cadmium telluride (HgCdTe) to name a few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN) and gallium nitride (GaN) or silicon-silicon carbide ($Si_xC_{1-x}$) and SiGe heterojunction semiconductor material. For power semiconductor applications currently mainly Si, SiC and GaN materials are used. If the semiconductor body comprises a high band gap material such as SiC or GaN which has a high breakdown voltage and high critical electric field strength, respectively, above which avalanche multiplication sets in, the doping of the respective semiconductor regions can be chosen higher which reduces the on-resistance $R_{on}$.

The semiconductor body 40 is typically a wafer or a chip 40. Typically, semiconductor body 40 includes an n-type first semiconductor region 1, an n-type fifth semiconductor region 5, and a p-type fourth semiconductor region 4 which is arranged between the fifth semiconductor region 5 and the first semiconductor region 1. The majority charge carriers of the n-type first semiconductor region 1 are negatively charged electrons. The majority charge carriers of the p-type fourth semiconductor region 4 are positively charged holes. Between the fourth semiconductor region 4 and the fifth semiconductor region 5 and between the fourth semiconductor region 4 and the first semiconductor region 1 respective pn-junctions are formed.

In the exemplary embodiment of FIG. 1, three vertical trenches 60, 61 and 62 extend from the main surface 15, through the fifth semiconductor region 5, the fourth semiconductor region 4 and partially into the first semiconductor region 1. Typically, the first semiconductor region 1, the fourth semiconductor region and the fifth semiconductor region 5 form a drift region 1, a body region 4 and a source region 5, respectively. Each of the trenches 60 to 62 includes a respective electrode structure including a gate electrode 11 which is insulated from the semiconductor body 40 by a respective dielectric region.

Each dielectric region typically includes a dielectric plug 82, which insulates the gate electrode from a source metallization 90, and a gate dielectric layer 81 which is arranged next to the body region 4. The drift region 1 is in ohmic contact with a drain electrode 91 on the back side 16 via an optional field stop layer 2 and an $n^+$-type drift contact layer 3. In the context of the present specification, the terms "in ohmic contact", "in electric contact", "in contact", and "electrically connected" intend to describe that there is an electrically conductive connection or ohmic current path between two regions, portion or parts of a semiconductor device, in particular a connection of low ohmic resistance, even if no voltages are applied to the semiconductor device. Typically, body region 4 is electrically connected to source electrode 90 via a $p^+$-type body contact region 6. The doping concentrations of source region 5 and body contact region 6 are typically higher than the doping concentration of drift region 1.

Due to short-circuiting source region 5 and body region 4, semiconductor device 100 blocks current in only one current direction. In forward mode or in blocking operation, the voltage difference $V_{DS}$ between drain electrode 91 and source electrode 90 is positive. Further, a not shown n-type channel region may be formed in body region 4 by positively activating the gate electrodes 11 relative to the body region 4. Accordingly, semiconductor device 100 may be operated as a field effect semiconductor device.

Different thereto, the voltage difference $V_{DS}$ is negative in backward mode. In the following, operating a semiconductor device in backward mode is also referred to as operating the semiconductor device in diode operation. In backward mode, the pn-junction formed between drift region 1 and body region 4, which is also referred to as body diode, is switched in forward current direction and may carry a backward current. Accordingly, semiconductor device 100 may be operated as a MOSFET with an integrated freewheeling diode. This may e.g. be used for switching inductive loads such as an electric motor. At high positive voltage difference $V_{DS}$, hot electrons $e^-$ may be generated in drift region 1 in an avalanche mode of semiconductor device 100. The avalanche mode may be desired but may result in device degradation over time. In backward mode, the voltage difference $V_{DS}$ is negative and the body diode is forwardly biased. Accordingly, the voltage drop across the semiconductor device ranges from the threshold voltage (0.7 V for silicon) at low current densities up to several volts at high current densities. In this case, electrons and holes are injected from the drain contact region 3 and the body region 4, respectively, into the drift region 1. Accordingly, the electron density and hole density are substantially equal in drift region 1 and typically much higher than the doping concentration. This means that drift region 1 is flooded with charge carriers. When the semiconductor device 100 is commutated, i.e. switched back to forward mode or blocking operation in which the body diode is reversely biased, the accumulated charge carriers in drift region 1 are drained off prior to and during forming a space charge region at the pn-junction of the body diode. Due to the lower doping of drift region 1 compared to body region 4, the main part of the blocking voltage typically drops across drift region 1. The electrical field strength in the space charge region mainly depends on the charge distribution. During commutation, not only the positive dopant ions but also the positive charge of the holes, which flow through the space charge region toward body region 4, contribute to the field strength distribution in drift region 1. Accordingly, the gradient of electric field strength is higher with flowing holes. Consequently, avalanche multiplication of electrons may occur at lower voltages compared to static avalanche conditions in blocking operation. Thus, hot electrons may be generated by avalanche multiplication during blocking operation at high voltages and/or during commutating into blocking operation. The term "avalanche condition" as used in this specification shall embrace both static avalanche conditions during blocking operation of a semiconductor device and dynamic avalanche conditions during commutating of a semiconductor device into blocking operation.

According to an embodiment, the electrode structures of the trenches 60, 61, 62 are insulated from drift region 4 in respective lower trench portions 601, 611, 621 by respective negatively charged dielectric portions 30. Accordingly, hot electrons $e^-$ which are generated during blocking operation of semiconductor device 100 and/or during commutating of semiconductor device 100 into blocking operation are repelled from the negatively charged dielectric portions 30. Hot electrons which are generated in a similar device but without negatively charged dielectric portions may result in device degradation. In particular hot electrons which are generated close to an interface between the drift region and the insulation of the trenches may enter the insulation with high enough energy to cause damages of the insulation. This process is avoided or at least reduced by the negatively charged dielectric portions 30 of semiconductor device 100.

The term "hot charge carrier" as used in this specification intends to describe a charge carrier which is not in thermal equilibrium with the lattice. The term "hot charge carrier" as used in this specification embraces a charge carrier with high enough energy to enter the conduction band of the dielectric region. Within this specification, protecting semiconductor devices against hot charge carrier degradation is mainly explained with respect to hot electrons forming the majority charge carriers of an n-doped semiconductor region. It goes without saying, that the hot charge carriers may also be hot holes. Hot electrons and hot holes can be injected into a dielectric which can adjoin either a p-doped or an n-doped semiconductor region. Hot charge carriers are typically formed in high electric field regions of the semiconductor device. However, they may also be thermally generated and accelerated e.g. in an electrical field. The negatively charged dielectric portions 30 include fixed charges of the same charge type as the majority charge carriers of drift region 1, i.e. fixed negative charges for the shown n-doped drift region 1 in FIG. 1. In the case of an adjoining p-doped semiconductor region, fixed positive charges are embedded in the charged dielectric portions 30. Accordingly, the charged dielectric portion 30 forms a Coulomb screen against hot majority charge carriers of the adjoining drift region 1. As illustrated by the dashed arrows in FIG. 1, hot electrons e⁻ are prevented by the Coulomb screen from reaching charged dielectric portion 30 and guided within drift region 1 toward drain electrode 91. Typically, hot electrons e⁻ are at least deflected from the semiconductor-insulator interfaces formed in the lower portion 601, 611, 621 of the respective trenches 60, 61, 62. This means, that hot electrons e⁻ are, in avalanche mode, at least deflected from regions of highest electric field strength which are close to the semiconductor-insulator interface. Accordingly, dielectric portions 30 and typically also dielectric portion 81 are protected against incorporation or entrapment of hot electrons. Thus, a change of properties of the dielectric layer is typically avoided. Accordingly, the switching behavior and/or the transistor characteristics of semiconductor device 100 are typically not or almost not affected by hot carrier injection. This in turn avoids e.g., the destruction of other parts of the circuit and/or EMC problems (Electro-Magnetic Compatibility) which may arise in semiconductor devices without charged dielectric portion 30 over time. Furthermore, injection of hot electrons into dielectric regions may damage them and/or cause formation of trapped positive charges. Incorporation of positive charges may cause a self-amplified change of transistor characteristics and/or switching behavior. In this case, hot electrons which are created in a subsequent process are attracted by the entrapped positive charges. Due to the negatively charged dielectric portion 30, a self-amplified change of the switching behavior, which may even cause device destruction, is typically avoided. Thus, semiconductor device 100 is protected against hot carrier induced degradation.

In the illustration of FIG. 1, three possible variants of different trench structures 60, 61, 62 with respective charged dielectric portions 30 are shown. Each variant may be used for a given embodiment. Each of the three trench structures 60 to 62 may form a unit cell in an active area of a power semiconductor device. Typically, a plurality of equal unit cells are thus arranged in the active area of the power semiconductor device 100. In other words, semiconductor device 100 includes a semiconductor body 40 with an n-type source region 5, an n-type drift region 1, a p-type body region 4, which is arranged between source region 5 and drift region 1, and at least one trench 60, 61, 62. The at least one trench 60, 61, 62 extends from source region 5, through body region 4 and into drift region 1 and includes an electrode structure which is insulated against semiconductor body 40 by a dielectric region. The dielectric region includes a negatively charged dielectric portion 30. It goes without saying, that the doping relations and the charge type of the charged dielectric portion may also be reversed.

In the lower portion 601 of trench 60 a field plate 12 is arranged which is insulated by a further dielectric plug 83 and the negatively charged region 30 against gate electrode 11 and drift region 1, respectively. In the lower portions 611 and 621 of trenches 61 and 62, respectively, a lower part of the respective gate electrode 11 below body region 4 may be operated as field plate. Accordingly, the negatively charged region 30 and the lower part of the gate oxide 81 typically form a field dielectric region. Typically, the negatively charged dielectric portion 30 is arranged in a portion of the field dielectric region which is next to a region of highest electron current in an avalanche mode to protect at least the parts of the field dielectric region which are at highest risk of hot charge carrier injection. The field plate 12 and the lower parts of the gate electrodes 11 may further be used as compensation structures. Accordingly, the drift region 1 may be higher doped than the optional layer 2. For example, the drift region may be n-doped and the optional layer 2 may be n⁻-doped. In this case, a further n-doped semiconductor layer having a higher doping concentration than the drift region 1 may be arranged between the optional layer 2 and the drift contact layer 3.

Semiconductor device 100 may also be described as a semiconductor device 100 having a semiconductor body 40 with a first semiconductor region 1 of a first conductivity type and a dielectric region having a charged dielectric portion 30 with fixed charges and a dielectric portion 81. The charge type of the fixed charges is equal to the charge type of the majority charge carriers of the first semiconductor region 1. Dielectric portion 81 may be uncharged or may also comprise fixed charges with a first maximum charge carrier density per area. The charged dielectric portion 30 has a second maximum charge carrier density per area which is larger than the first maximum charge carrier density per area. Typically, the second maximum charge carrier density per area is larger than about 10 times the first maximum charge carrier density per area. In the following, dielectric portion 81 and charged dielectric portion 30 are also referred to as a first charged dielectric portion 81 and a second charged dielectric portion 30, respectively.

According to an embodiment, the dielectric region forms a dielectric-semiconductor-interface with the first semiconductor region 1. Typically, the dielectric region is arranged between the first semiconductor region 1 and a gate electrode 11 and/or between the first semiconductor region 1 and a field plate 12 and/or along a drift region 1 formed by the first semiconductor region 1. As illustrated in trenches 61 and 62, charged dielectric portion 30 may be arranged between gate electrode 11 and drift region 1. However, the charged dielectric portion 30 is typically not arranged between gate electrode 11 and a body region 4. This means, that the charged dielectric portion 30 is typically not part of a gate dielectric layer next to a channel region in body region 4. This is to avoid changing the threshold voltage of gate electrode 11. In other words, a gate electrode 11 which extends into the drift region 1 is typically insulated from drift region 1 by a charged dielectric portion 30 in a lower part below body region 4 where the gate electrode 11 may be operated as field plate. Accordingly, the charged dielectric portion, which is in the following also referred to as charged dielectric region 30 and charged dielectric layer 30, is typically arranged along drift region 1 of semiconductor device 100 and forms a dielectric-semiconductor interface with drift region 1. Typically, charged dielectric layer 30 is arranged close to regions of highest electric field in blocking operation of semiconductor device 100.

According to embodiments, the n-type drain contact region 3 is replaced by a p-type collector region for forming an IGBT or a horizontally alternating arrangement of n-type and p-type regions for forming an IGBT with integrated freewheeling diode. Accordingly, the electrodes 90 and 91 form an emitter electrode 90 and collector electrode 91, respectively. Due to the charged dielectric layers 30, hot electrons generated in an avalanche mode of the IGBT are at least deflected from the lower trench portions. Thus, the IGBT is protected against hot charge carrier induced degradation.

Figure 2:
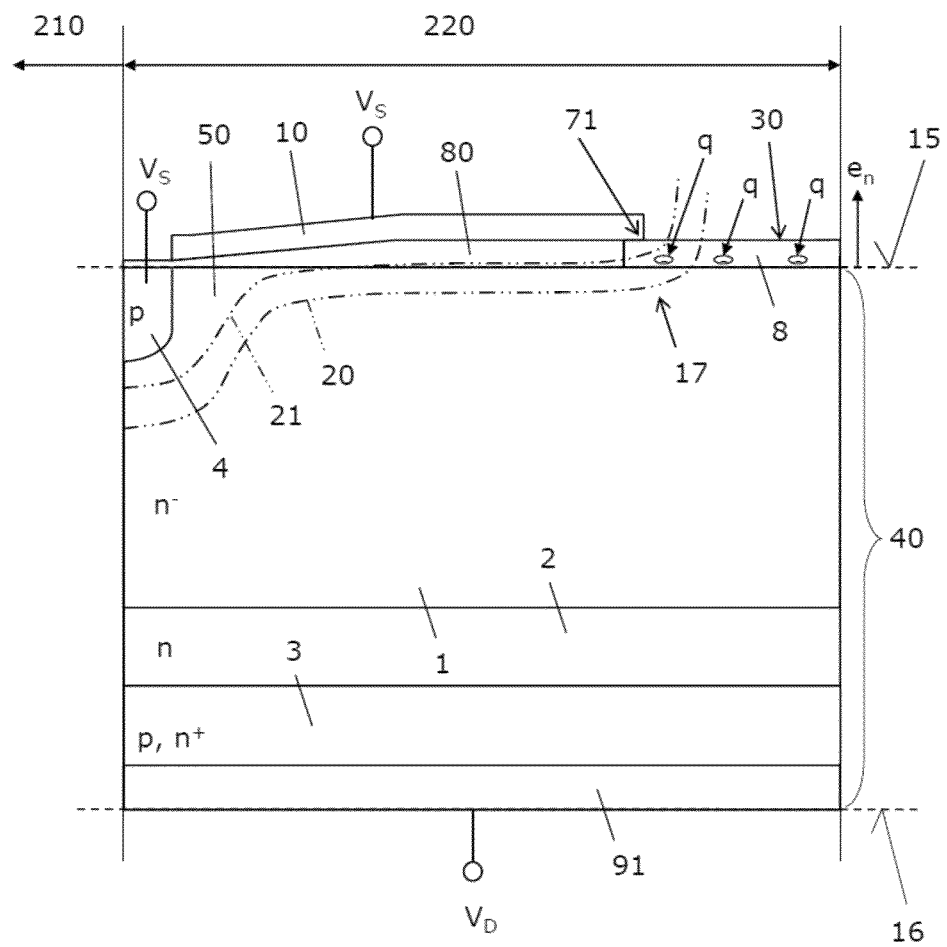
FIG. 2 schematically illustrates a vertical cross-section of a vertical semiconductor device according to one or more embodiments.

FIG. 2 illustrates an embodiment of a vertical power semiconductor device 200 in a section of a vertical cross-section. In the section of FIG. 2 only a peripheral area or edge area 220 with an exemplary edge termination is illustrated in detail. The adjoining active area 210 of semiconductor body 40 typically includes a plurality of transistor structures, for example a plurality of field effect transistor cells as explained with reference to FIG. 1. Typically, a first n-type semiconductor region 1, which typically forms a drift region 1 in the active area 210, reaches main surface 15 in the peripheral area 220. To ensure high blocking voltage an edge termination with an insulated field plate 10 is arranged on main surface 15. Field plate 10 is insulated against semiconductor body 40 by a field insulating region. Field plate 10 may be electrically floating or may be connected to a voltage. In the exemplary embodiment of FIG. 2, field plate 10 is connected to the voltage of p-type fourth semiconductor region 4. The fourth semiconductor region forms, with the first semiconductor region 1, the blocking pn-junction of semiconductor device 200 which is required for setting up a blocking capability.

According to an embodiment, the field insulating region includes a first dielectric portion 80 and a negatively charged dielectric portion 30. The first dielectric portion 80 may be slightly positively charged, more typically uncharged or charged with negative charge carriers up to a first maximum charge carrier density per area. The negatively charged dielectric portion 30 is arranged next to an edge 71 of the field plate 10 and charged with negative charge carriers up to a maximum charge carrier density per area which is larger than the first maximum charge carrier density per area. FIG. 2 illustrates semiconductor device 200 during blocking mode or blocking operation in which the first semiconductor region 1 is partly or completely depleted. During blocking mode, the voltage difference between the voltage $V_S$ between fourth semiconductor region 4 and the voltage $V_D$ of drain electrode 91 is negative, i.e. $V_S < V_D$. Field plate 10 is typically connected with a p-type fourth semiconductor region 4 which may form a body region 4 in the active area 210 of a MOSFET or an IGBT. Depending on the semiconductor device implemented, in addition to the fourth semiconductor region 4 or instead of the fourth semiconductor region 4, planar transistor cells (not shown) or transistor cells having electrode structures arranged in vertical trenches, as shown e.g. in FIG. 1, can also be connected. Alternatively, p-type fourth semiconductor region 4 may form an anode of a diode. Field plate 10 provides an equipotential surface. Close to field plate 21 exemplary equipotential lines 20, 21 are substantially parallel to field plate 10. Thus, equipotential line 20 in FIG. 2 crosses main surface 15 of semiconductor body close to edge 71. Due to the negatively charged dielectric portion 30 the equipotential lines are redistributed in blocking mode of semiconductor device 200 such that a region 17 of highest electric field in semiconductor region 1 next to edge 71 of field plate 10 is avoided. Accordingly, the risk of generation of hot electrons is reduced. Further, hot electrons are deflected by the Coulomb screen of the negatively charged dielectric portion 30. Accordingly, the field insulating region is protected against hot charge carrier induced degradation. It goes again without saying that charged dielectric portion 30 may also be positively charged when the doping types of the semiconductor regions of semiconductor device 200 are reversed.

Typically, the charge carrier density per area of the charged portion 30 decreases step-wise or continuously toward the outer border of the edge termination structure. Accordingly, the maximum field strength in semiconductor region 1 during blocking mode may further be reduced. In other embodiments, the charge carrier density per area of charged portion 30 is substantially constant. In FIG. 2 the charges in charged dielectric portion 30 are depicted as condensed charges q. Typically, charge is substantially continuously distributed in a horizontal plane in charged dielectric portion 30 of FIG. 2.

The first dielectric portion 80 may also be negatively charged to be better shielded against incorporation of thermally generated hot majority charge carriers when the semiconductor device is in blocking mode.

In other embodiments, only one uniformly charged field insulating region 30 is used to insulate field plate 10 and the first semiconductor region 1.

Figure 3:
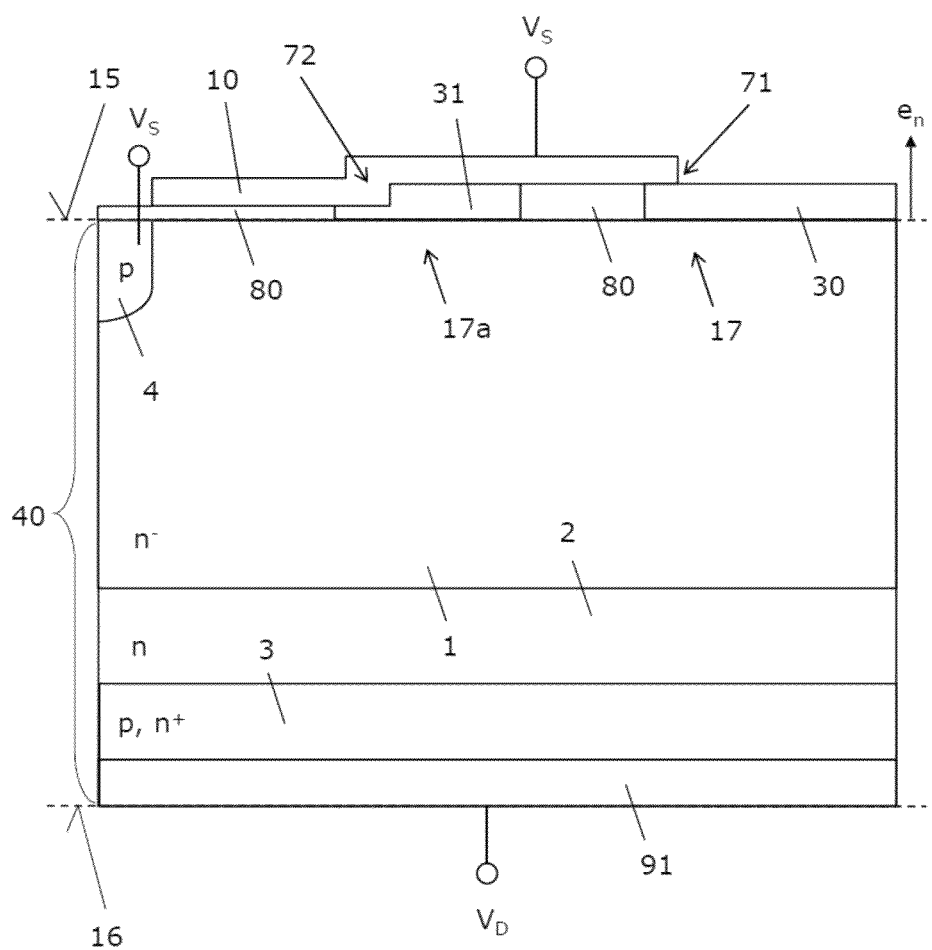
FIG. 3 schematically illustrates vertical cross-sections of a semiconductor device according to one or more embodiments.

FIG. 3 illustrates an embodiment of a vertical power semiconductor device 201 in a section of a vertical cross-section. Power semiconductor device 210 is similar to power semiconductor device 200 of FIG. 2. However, the section of FIG. 3 only illustrates the peripheral area 221. Further, the edge termination structure of FIG. 3 includes a field plate 10 with an additional step 72. According to an embodiment, a further negatively charged dielectric portion 31 of increased charge carrier density per area is additionally arranged next to step 72. Accordingly, an electric field maximum 17*a* in semiconductor region 1 and close to step 72 may be reduced or even avoided. In the embodiment of FIG. 3, the negative charge carrier density per area of the field insulating region formed by the portions 30, 31, and the two lower or not charged portions 80 changes step-wise in horizontal direction. In other embodiments, the charge carrier density per area of the charged portions changes smoothly. For example, the charge carrier density per area may continuously decrease with horizontal distance to the edge 71 and/or step 72 of field electrode 10. Alternatively, the charge carrier density per area can also be substantially constant laterally.

Figure 4:
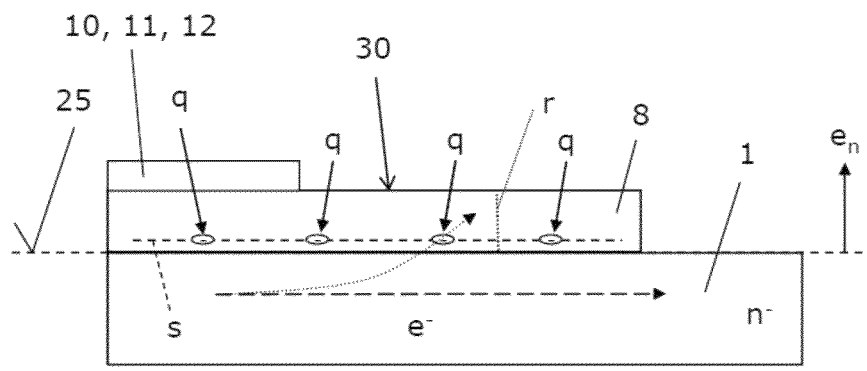
FIG. 4 schematically illustrates a vertical cross-section of a vertical semiconductor device according to one or more embodiments.
Figure 4:
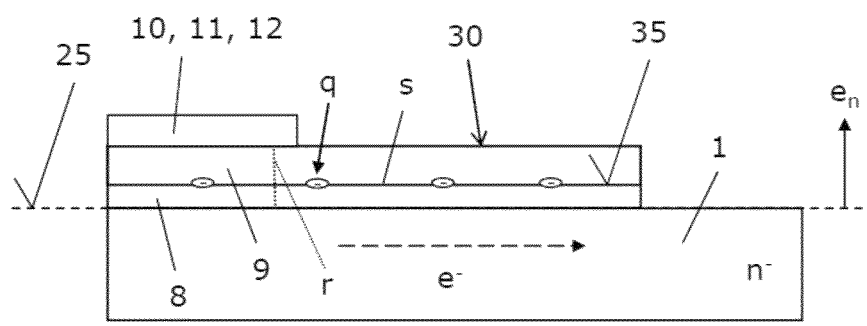
Figure 4:
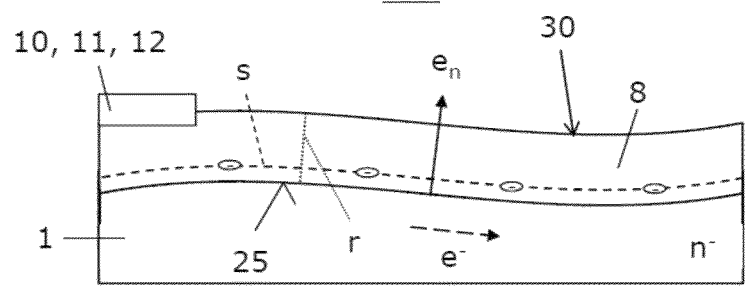

With respect to FIG. 4 further embodiments will be explained. FIG. 4 illustrates three semiconductor devices 101, 102 and 103 in a section of a vertical cross-section. The semiconductor devices 101 to 103 may correspond to sections of the semiconductor devices 100, 200 and 201 explained with respect to FIGS. 1 to 3. This means, that the structures 101 to 103 may be part of field plate structure or an edge termination structure. They may however also be arranged along a drift region 1 but further away from electrodes which may be operated as field plates. This will explained in more detail below with reference to FIGS. 6 to 9. Accordingly the shown electrodes 10 to 20 in FIG. 4 are only optional.

The semiconductor devices 101, 102, 103 have a first semiconductor region 1 and a charged dielectric layer 30 which is arranged next to the first semiconductor region 1 and includes fixed charges q. Typically, the charged dielectric layer 30 forms an interface 25 with the first semiconductor region 1. The interface 25 may be a main surface of a semiconductor body, an interface in a trench extending into the first semiconductor region, or an interface of a buried oxide layer. The charge type of the fixed charges q is equal to the charge type of the majority charge carriers of the first semiconductor region 1. In the embodiments of FIG. 4, the charged dielectric layer 30 is negatively charged. The charge carrier density per area of the charged dielectric layer 30 is chosen such that the charged dielectric layer 30 is shielded against incorporation of hot majority charge carriers generated in the first semiconductor region 1. In other words, an appropriately charged dielectric layer 30 is used to protect the semiconductor device 101 to 103 against hot charge carrier induced degradation. Due to the Coulomb shield formed by the fixed charges q in the charged dielectric layer 30, injection of hot electrons e$^-$ into the charged dielectric layer 30 is prevented or at least reduced. The hot electrons e$^-$ are typically guided in semiconductor region 1 at a safe distance from the charged dielectric layer 30 until they thermalize, recombine at a pn-junction, are discharged at an electrode, or injected into an uncritical dielectric region in which fixed charges do not or almost do not influence the characteristics of the semiconductor device. Accordingly, the degradation of charged dielectric layer 30 is prevented or at least reduced. This is illustrated for the semiconductor device 101 by the dashed arrow.

The charged dielectric layer 30 of semiconductor device 101 is formed by a dielectric layer 8 which includes fixed charges q. For clarity reasons, only a few negative charges q are shown in dielectric layer 8. Dielectric layer 8 has a charge carrier density per area of fixed charges q which may be defined as the integrated charge carrier density of fixed charges per volume along a line r through dielectric layer 8. Charge density per volume can vary on the way normal to the interface 25 or may be homogeneously distributed, depending on the process used to generate charge in layer 30. In particular, portions with areas of positive and negative charge in dielectric layer 8 could also alternate along a line r through dielectric layer 8, the net charge of which portions, i.e. the correctly signed integration of all charge carriers thereof along line r, causes the described shielding effect against hot charge carrier injection. Typically, line r is normal to the interface 25 between charged dielectric layer 8 and first semiconductor region 1. The charge carrier density per area of fixed charges q may be constant, at least in sections, or vary along a path s which is substantially parallel to the interface 25.

According to an embodiment, the charged dielectric layer 8 is formed as a doped dielectric region having fixed charges. The charged dielectric layer 8 may e.g. be formed of silicon dioxide doped with aluminum, nitrogen or cesium. Aluminum-doped and nitrogen-doped silicon dioxide is typically negatively charged, whereas cesium doped silicon dioxide is typically positively charged.

The charge carrier density per area of fixed charges q depends on dopant concentration. Typically, the absolute value of the charge carrier density per area is larger than about $10^{11}/cm^2$, more typically larger than about $10^{12}/cm^2$. Higher absolute values of the charge carrier density per area ensure a better shielding against hot charge carriers. The upper limit of the charge carrier density per area is typically given by the charge density per area causing avalanche multiplication in the adjoining semiconductor material of semiconductor region 1. The upper limit of the charge carrier density per area is about $2*10^{12}/cm^2$ to about $4*10^{12}/cm^2$ for silicon depending on the level of doping. For SiC and GaN the upper limit of the charge carrier density per area is about $2*10^{13}/cm^2$.

The charged dielectric layer 30 of semiconductor device 102 has similar properties with respect to fixed charge carrier density per area as the charged dielectric layer 30 of semiconductor device 101. However, the charged dielectric layer 30 of semiconductor device 102 is formed as a stack of different dielectric layers 8, 9 with fixed charges q arranged therebetween as surface charges q. A first dielectric layer 8, e.g. a layer of $SiO_2$, is arranged on the first semiconductor region 1 and a second gate dielectric layer 9, e.g. a $Si_3N_4$ layer, is arranged on the first gate dielectric layer 8. The charged layer 30 includes an interface 35 formed between the first and second gate dielectric layer 8, 9. $Si_3N_4$ has a lower band gap than $SiO_2$. Accordingly, negative charges q are usually trapped in $Si_3N_4$ at or close to the interface with $SiO_2$. The charged dielectric layer 30 of semiconductor device 102 may also include a layer of higher dielectric constant such as aluminum oxide, hafnium dioxide, hafnium silicate, or zirconium dioxide. These materials may be deposited using chemical vapor deposition (CVD) or atomic layer deposition (ALD) and allow dielectric constants of more than about 7 and even more than about 20.

The charged dielectric layer 30 of semiconductor device 103 has similar properties with respect to fixed charge carrier density per area as the charged dielectric layer 30 of semiconductor device 101 and semiconductor device 102, respectively. It may either be formed of a doped layer 8 or a stack of layers. As the interface 25 between semiconductor region 1 and the charged doped layer 8 is curved, the charge carrier density per area of fixed charges is typically determined for a curved path s which is substantially parallel to the interface 25. The charge carrier density per area of fixed charges q is typically also defined as the integrated charge carrier density of fixed charges per volume along a line r through dielectric layer 8, wherein r is substantially normal to the interface 25 between charged dielectric layer 8 and first semiconductor region 1. Accordingly, the charge carrier density per area of the fixed charges may change step-wise or continuously along the curved path s in the charged dielectric layer, with the curved path s being substantially parallel to the interface 25.

Typically, the charged dielectric layer 30 is arranged between a field plate 10, 12 and a drift region 1, or between drift region 1 and a portion of a gate electrode 11 which may be operated as a field plate and/or along the drift region at a main surface of a semiconductor device.

Figure 5:
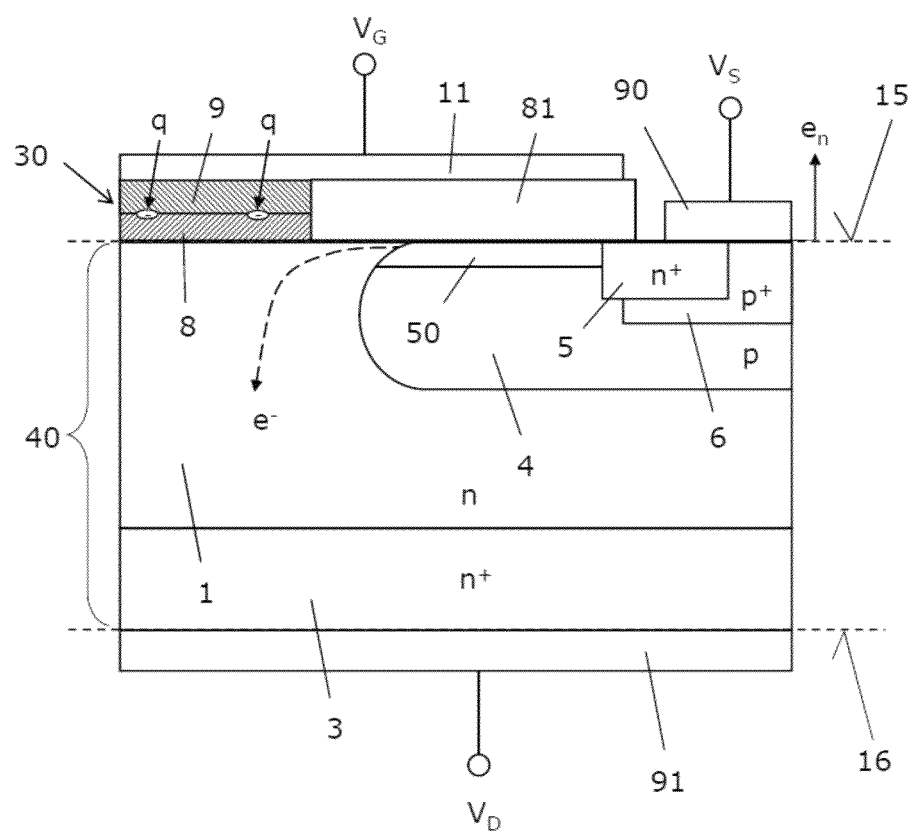
FIG. 5 schematically illustrates a vertical cross-section of a vertical semiconductor device according to one or more embodiments.

FIG. 5 illustrates an embodiment of a vertical power semiconductor device 250 in a section of a vertical cross-section. The power semiconductor device 250 is also a vertical n-channel power semiconductor device, typically a DMOS-FET (double-diffused metal-oxide semiconductor field effect transistor). As such the section of FIG. 5 typically corresponds to a unit cell of an active area of semiconductor device 250. The power semiconductor device 250 includes a semiconductor body 40 between a main surface 15 and a lower surface 16. An n-type drift region 1 extends to main surface 15 and includes a partially embedded p-type body region 4 or well 4 which also extends to main surface 15 and is contacted via a p$^+$-type body contact region 6 to a source electrode 90 arranged on main surface 15. A gate electrode 11 is arranged on main surface 15 and insulated from semiconductor body 40 by a gate dielectric layer 81 and a charged dielectric layer 30. Gate dielectric layer 81 and charged dielectric layer 30 are arranged side by side in a direction which is parallel to the current flow in channel region 50, i.e. in a horizontal direction in the embodiment of FIG. 5. Above a high enough positive threshold voltage between gate electrode 11 and source electrode 90 an n-channel region 50 is formed in body region 4. Accordingly, a current between an n$^+$-type source region 5 connected with source electrode 90 and a drain electrode 91 on lower surface 16 may flow in a forward current mode. Drain electrode 91 is typically in ohmic contact with drift region 1 via an n$^+$-type drain contact region 3.

Typically, gate dielectric layer 81 adjoins channel region 50 and has a lower maximum charge carrier density per area than the negatively charged dielectric layer 30 which is typically spaced apart from channel region 50. Typically, the maximum charge carrier density per area of gate dielectric layer 81 is below $10^{11}/cm^2$, more typically below $10^{10}/cm^2$. Further, charged dielectric layer 30 is spaced apart in horizontal direction from body region 4. Accordingly, a low threshold voltage $V_{th}=V_G-V_S$ for forming the n-type channel 50 in channel region 5 is ensured.

Different thereto, the maximum charge carrier density per area of the negatively charged dielectric layer 30 is typically larger than $10^{11}/cm^2$, more typically larger than $10^{12}/cm^2$ to ensure a sufficiently strong Coulomb screen for hot majority charge carriers which may be generated in drift region 1 in blocking operation.

According to an embodiment, the semiconductor devices as described herein are n-channel field-effect semiconductor devices which each include a semiconductor body 40 with an active area. The active area includes an n-type semiconductor region 1 and a negatively charged dielectric region 30 which is arranged next to the n-type semiconductor region 1. The negatively charged region 30 has fixed negative charges with a maximum charge carrier density per area which is larger than about $10^{11}/cm^2$, more typically larger than about $10^{12}/cm^2$. This applies not only to vertical but also to lateral semiconductor devices as illustrated with respect to the following FIGS. 6 to 9.

Figure 6:
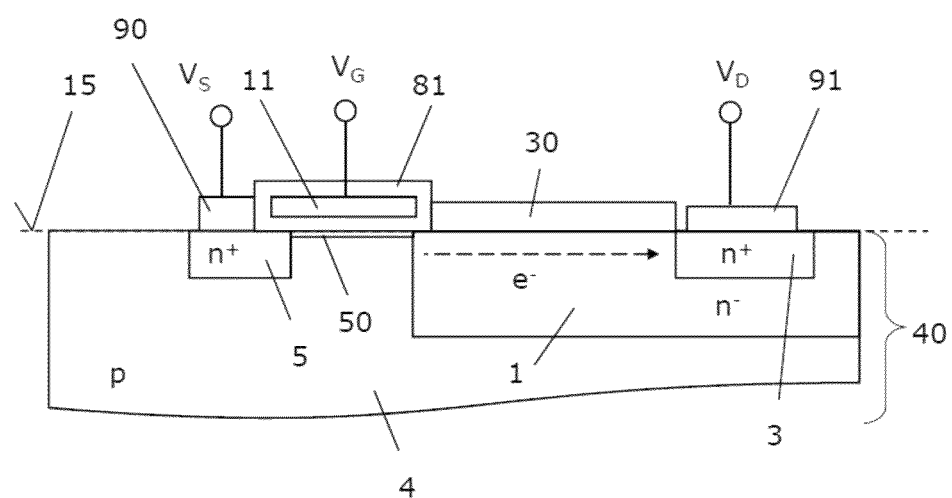
FIG. 6 schematically illustrates a vertical cross-section of a lateral semiconductor device according to one or more embodiments.

FIG. 6 illustrates an embodiment of a lateral MOSFET 300 in a section of a vertical cross-section. Lateral MOSFET 300 includes a gate electrode 11, a source electrode 90 and a drain electrode 91 which are arranged on a main surface 15 of a semiconductor body 40. MOSFET 300 is typically also a power semiconductor device. In the embodiment of FIG. 6, an n-type drift region 1 is partially embedded in a p-type body region 4 which extends between the main surface 15 and a lower surface 16. Body region 4 is contacted with source electrode 90 by a $p^+$-type body contact region 6. Drift region 1 is contacted via an $n^+$-type drain contact region 3 with drain electrode 91 and via an $n^+$-type source region 5 with source electrode 90. Drift region 1 extends to main surface 15.

According to an embodiment, a negatively charged dielectric layer 30 is arranged on drift region 1. Accordingly, a gate oxide layer 81 which insulates gate electrode 11 from semiconductor body 40 is protected against hot electron injection in blocking operation of semiconductor device 300. This is illustrated by the dashed arrow. In avalanche condition, carrier multiplication will not commence close to the main surface 15 but buried in the crystal e.g., at the level of the electron path shown in FIG. 6. In other words, a negatively charged dielectric layer 30 is arranged along at least a part of the drift region 1 to avoid or at least reduce hot carrier induced device degradation. Charged dielectric layer 30 reduces the effective specific conductance in drift region 1 at the surface leading to higher and undesired on-state resistance of the device. This may be easily overcome by slightly increasing the doping of drift region 1.

Figure 7:
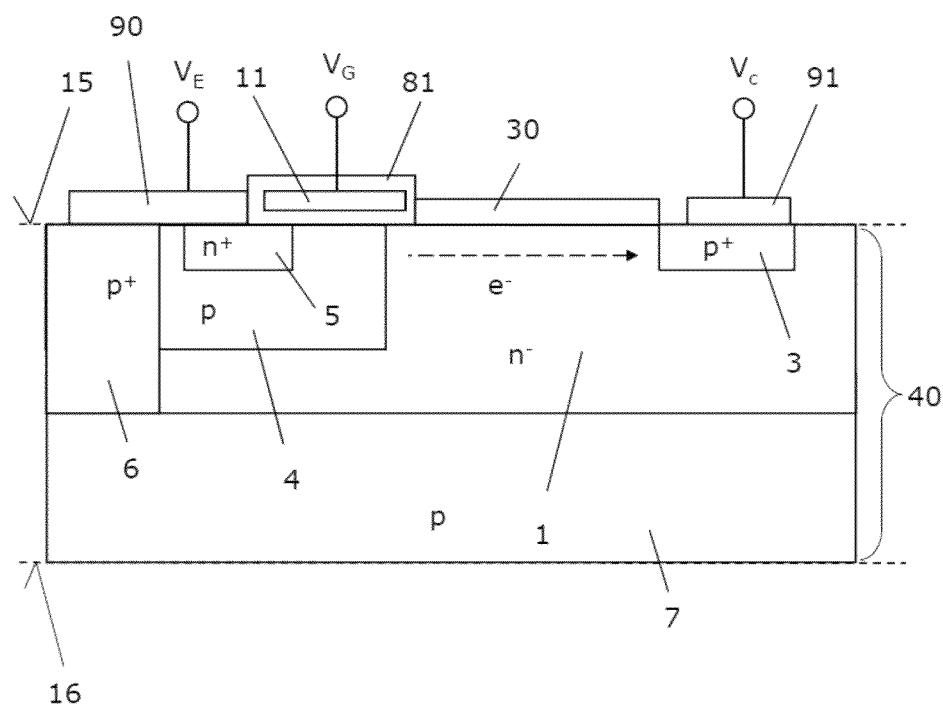
FIG. 7 schematically illustrates a vertical cross-section of a lateral semiconductor device according to one or more embodiments.

FIG. 7 illustrates an embodiment of a lateral IGBT 400 in a section of a vertical cross-section. The lateral IGBT 400 is similar to the lateral MOSFET 300 of FIG. 6. However, instead of the $n^+$-type drain contact region, a $p^+$-type collector region 3 is connected with electrode 91 of semiconductor device 400. In addition, body region 4 and drift region 1 are arranged on a common p-type substrate 7 which is also connected to electrode 90 by the $p^+$-type contact region 6. Further, the electrodes 90 and 91 are typically referred to as emitter electrode 90 and collector electrode 91, respectively. Alternatively, $p^+$-type and $n^+$-type contact regions (not shown) may be connected to the electrode 90 to ensure reverse diode operation. Alternatively, n-regions (not shown) may be arranged upstream of the $p^+$-type and/or $n^+$-type contact region 3 or may be present around the $p^+$-type and/or $n^+$-type contact region 3, which n-regions are more highly doped than drift region 1 and act as field stop in blocking operation.

According to an embodiment, a negatively charged dielectric layer 30 is arranged along at least a part of the drift region 1 to avoid or at least reduce hot carrier induced degradation of gate dielectric layer 81.

Figure 8:
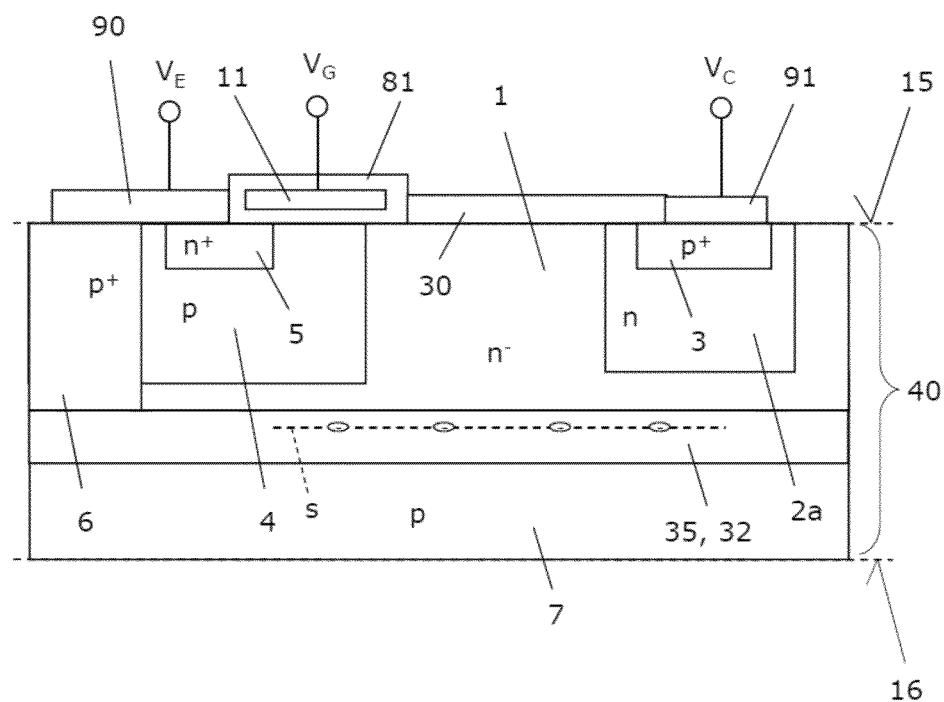
FIG. 8 schematically illustrates a vertical cross-section of a lateral semiconductor device according to one or more embodiments.

FIG. 8 illustrates an embodiment of a lateral IGBT 401 in a section of a vertical cross-section. The lateral IGBT 401 is similar to the lateral IGBT 400 of FIG. 7. However, the semiconductor device 401 is a silicon on insulator ("SOI") device. Accordingly, a buried oxide ("BOX") layer 35 is arranged between the common substrate 7 and the other semiconductor regions of semiconductor body 40. Further, an optional n-type well $2a$ is arranged between collector region 3 and drift region 1.

According to an embodiment, a further negatively charged dielectric region or layer 32 is formed by the buried oxide ("BOX") layer 35 of the silicon on insulator device 401. Due to the Coulomb screen generated by the fixed charges of charged dielectric region layers 30 and 32, hot-electron-induced device degradation may at least be reduced. The buried oxide layer 35 typically includes fixed negative charges with a charge carrier density per area of more than about $10^{11}/cm^2$ or even more than $10^{12}/cm^2$.

Figure 9:
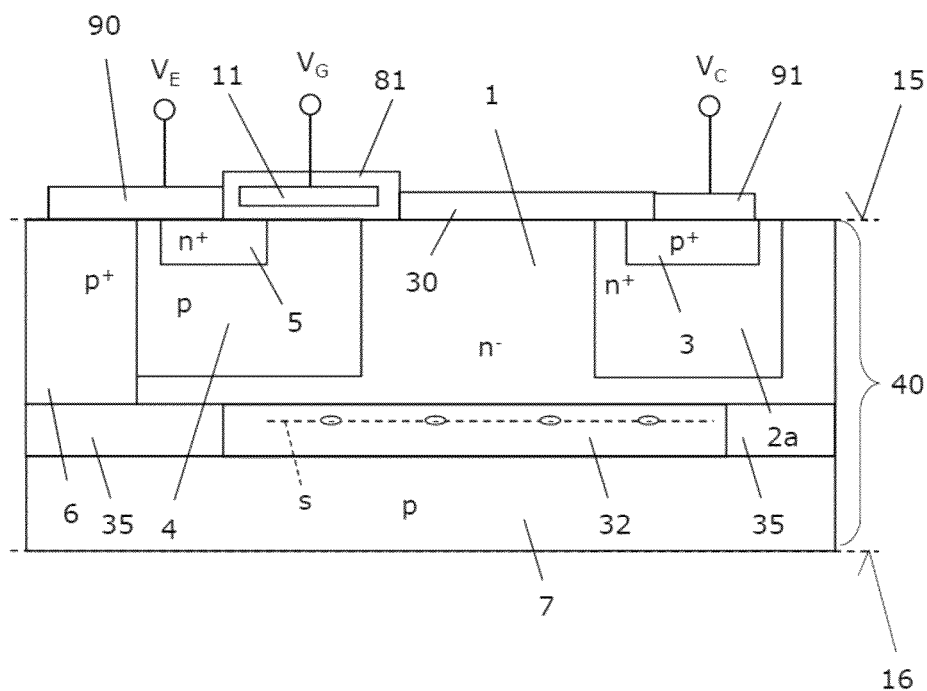
FIG. 9 schematically illustrates a vertical cross-section of a lateral semiconductor device according to one or more embodiments.

FIG. 9 illustrates an embodiment of a lateral IGBT 402 in a section of a vertical cross-section. The lateral IGBT 402 is similar to the lateral IGBT 401 of FIG. 8. However, only a portion 32 of the BOX-layer 35 is negatively charged. Typically, a portion 32 extends in horizontal direction at least between body region 4 and the n-type well $2a$.

Figure 10:
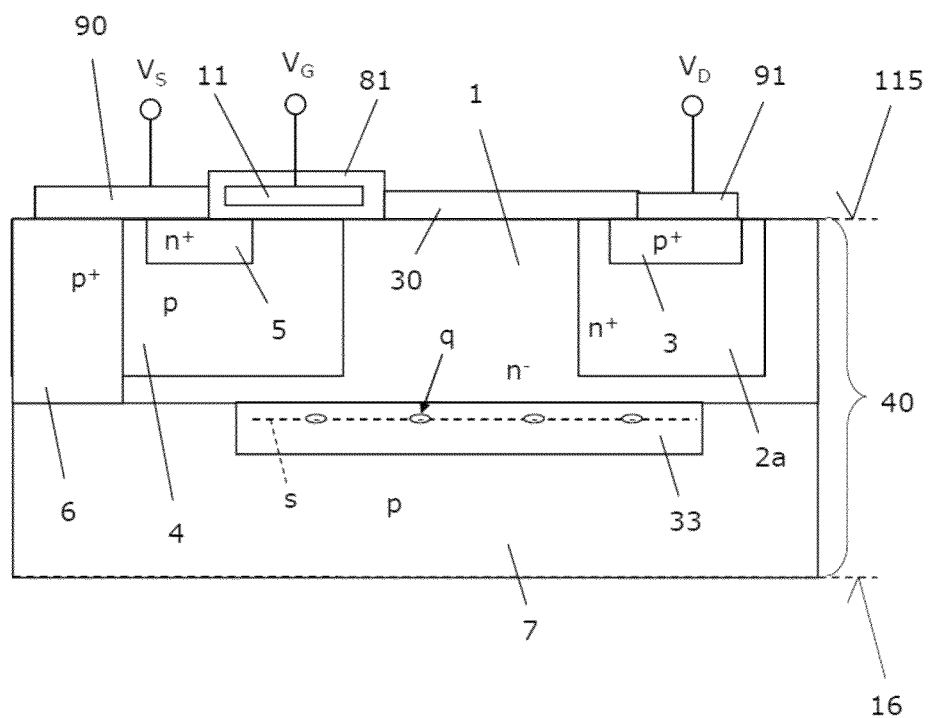
FIG. 10 schematically illustrates a vertical cross-section of a lateral semiconductor device according to one or more embodiments.
Figure 11:
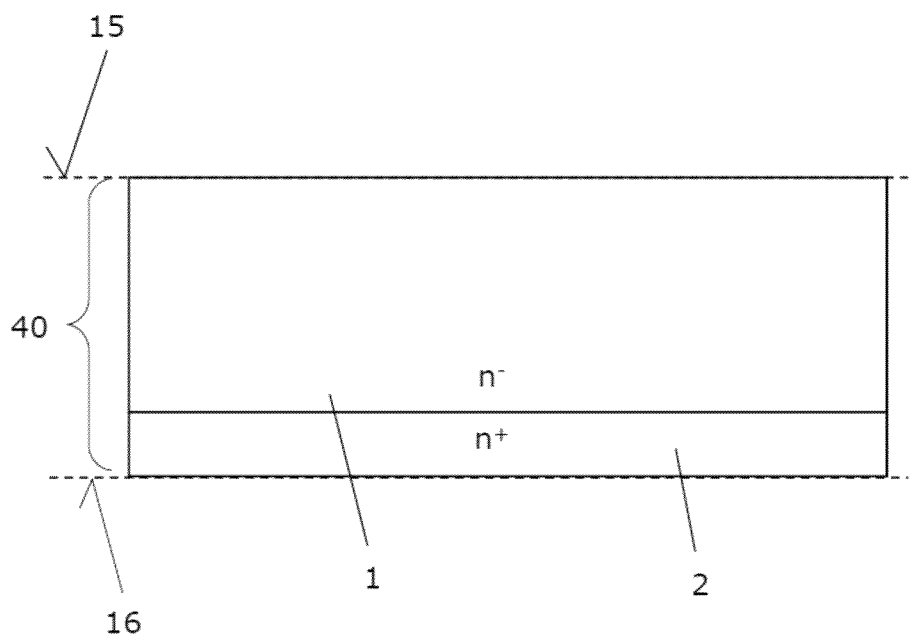
FIGS. 11-19 illustrate manufacturing processes according to one or more embodiments.

FIG. 10 illustrates an embodiment of a lateral IGBT 403 in a section of a vertical cross-section. The lateral IGBT 403 is similar to the lateral IGBT 402 of FIG. 9. However, IGBT 403 is formed on a partial silicon on insulator wafer having a charged partial BOX-layer 33.

It goes without saying, that the charged dielectric layers of FIGS. 7 to 10 may be combined.

With respect to FIGS. 11 to 19 methods for forming a semiconductor device 207 according to several embodiments are illustrated. Emphasis is placed on the layer generation on the main horizontal surface 15. Without further specification, doping regions in the semiconductor can be manufactured before and/or during and/or after the illustrated formation of charged layer. In a first process, a wafer or substrate 40 comprising a main horizontal surface 15 and a semiconductor layer 1 of a first conductivity type (n-type) is provided. Semiconductor layer 1 extends to main horizontal surface 15. Substrate 40 may be made of any suitable semiconductor material such as Si or GaN or SiC. A heavily doped $n^+$-type contact layer 2 may extend from semiconductor layer 1 to a lower surface 16 arranged opposite to the main surface 15 to later form an ohmic connection to a drain metallization. Further, substrate may already include embedded body regions of a second conductivity type (p-type).

Thereafter, a first dielectric layer $8a$ is formed on the main horizontal surface 15. Dielectric layer $8a$ typically includes $SiO_2$ and may be formed by deposition and/or thermal oxidation. $SiO_2$ may be deposited in a CVD (Chemical Vapor Deposition) process. Alternatively, silicon may be deposited on the semiconductor body 40 prior to thermally oxidizing. In the case of an Si-semiconductor body 40, layer $8a$ is typically formed by thermal oxidation, but may also be formed by a CVD process.

In a subsequent process, a second layer 8b is formed on the first dielectric layer 8a. According to an embodiment, second layer 8b is formed by atomic layer deposition (ALD). The thickness of layer 8b depends on the amount of charges to be trapped.

Figure 12:
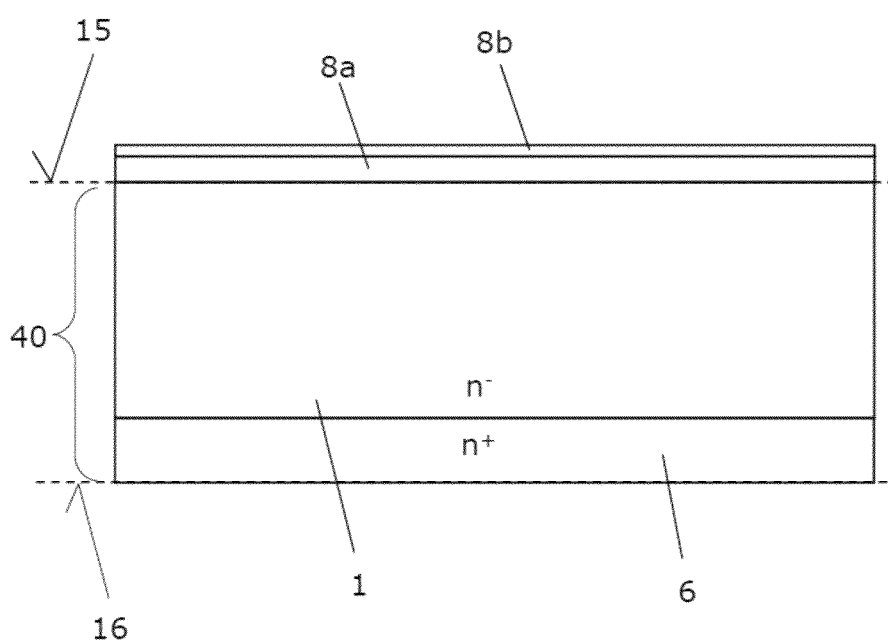

Typically, less than one molecule or atom layer is deposited in one ALD cycle. One up to several ALD cycles are typically used to form a thin layer 8b. The resulting semiconductor structure 207 is shown in FIG. 12.

Figure 13:
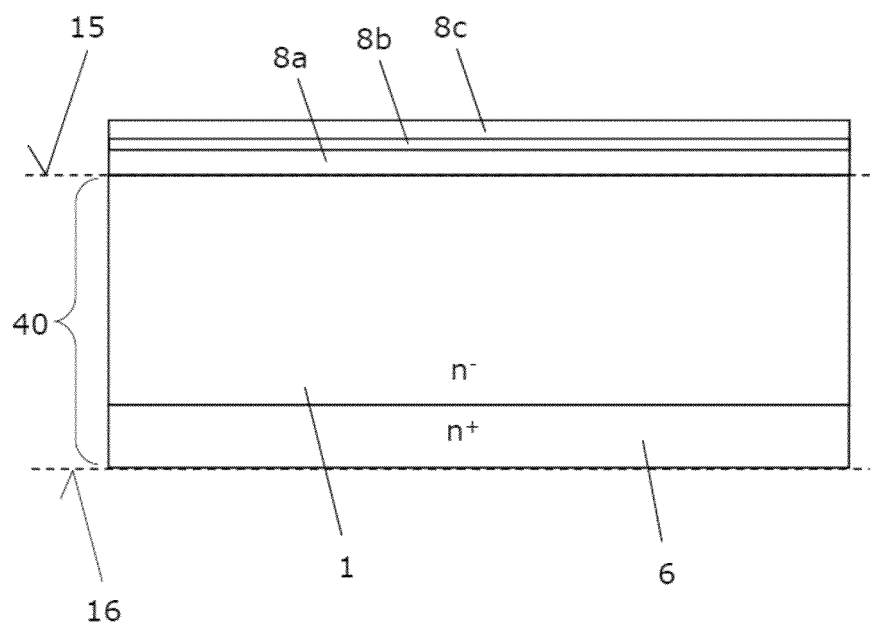

Thereafter, a second dielectric layer 8c, e.g. an $SiO_2$-layer, is formed on the second layer 8b. The resulting semiconductor structure 207 is shown in FIG. 13.

Figure 14:
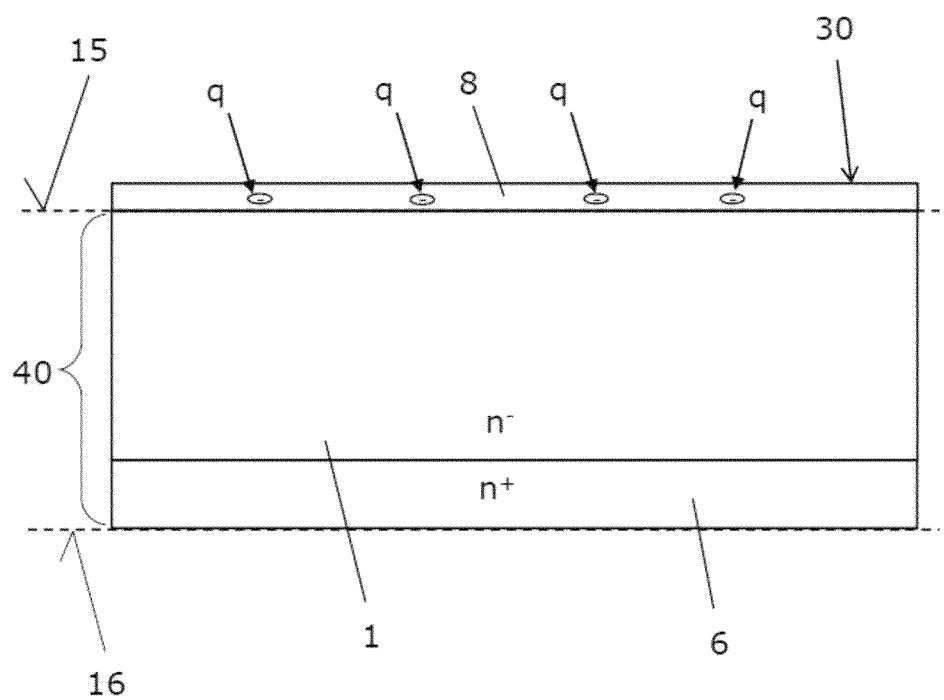

Typically, thermal steps with temperatures from about 700° C. to about 1250° C., more typically from about 800° C. to about 1000° C. are carried out after depositing layers 8b and 8c. Accordingly, a dielectric layer 8 with fixed charges is formed on the main surface 15 and in contact with layer 1. Depending on the desired charge type, the second layer 8b typically includes aluminum or aluminum oxide for forming a negatively charged layer 8 or cesium or cesium oxide to form a positively charged layer 8. The charge type of the fixed charges is equal to the charge type of the majority charge carriers of the first semiconductor region 1. The resulting structure 207 is shown in FIG. 14. Charged dielectric layer 8 and first semiconductor region 1 form a dielectric-semiconductor interface at main surface 15.

Charged layer 8 typically includes a net charge carrier density per area of more than about $10^{11}/cm^2$, and more typically of more than about $10^{12}/cm^2$.

In another embodiment, layers 8a, 8b and 8c form an $SiO_2$—$Si_3N_4$—$SiO_2$-sandwich structure with fixed negative charges. In this embodiment, additional thermal annealing steps to form a common layer 8 are typically not carried out. The sandwich structure or stack structure may include layers having a relative dielectric constant which is higher than about 7 or even 20. The individual layers can in this case also have fixed charges of different level and/or with different signs.

Figure 15:
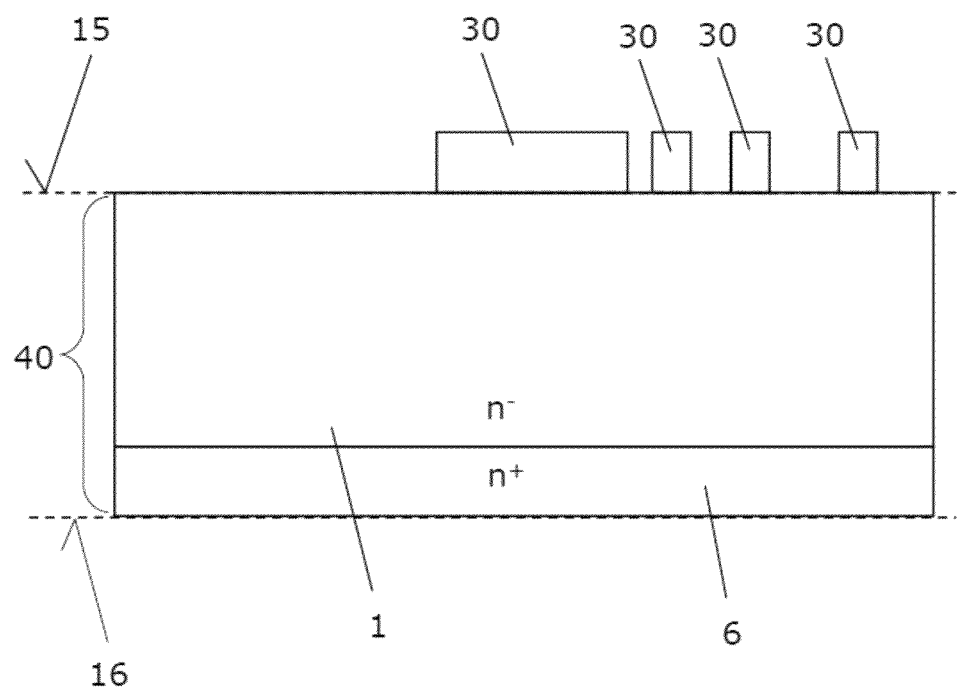

In another embodiment, layer 8b is only formed in a part on layer 8a. This may be achieved by depositing a structured anti-adhesive layer prior to depositing layer 8b and/or by masked etching of charged layer 8 and/or by partial etching of charged layer 8. For example, charged layer 8 may be etched through a mask to main surface 15. Accordingly, different charged regions 30 may be formed by the masked etching process as shown in FIG. 15. Accordingly, the charge carrier density per area may vary in horizontal direction. In another embodiment, masked etching of charged layer 8 stops prior to reaching main surface 15. This may also be used to vary the charge carrier density per area in horizontal direction.

Subsequently, a dielectric region 80 is formed on main surface 15, e.g. in a CVD process or by thermally oxidizing. Dielectric region 80 has typically a lower charge carrier density per area than charged layer 8, typically less than about $10^{11}/cm^2$ or less than about $10^{10}/cm^2$.

Figure 16:
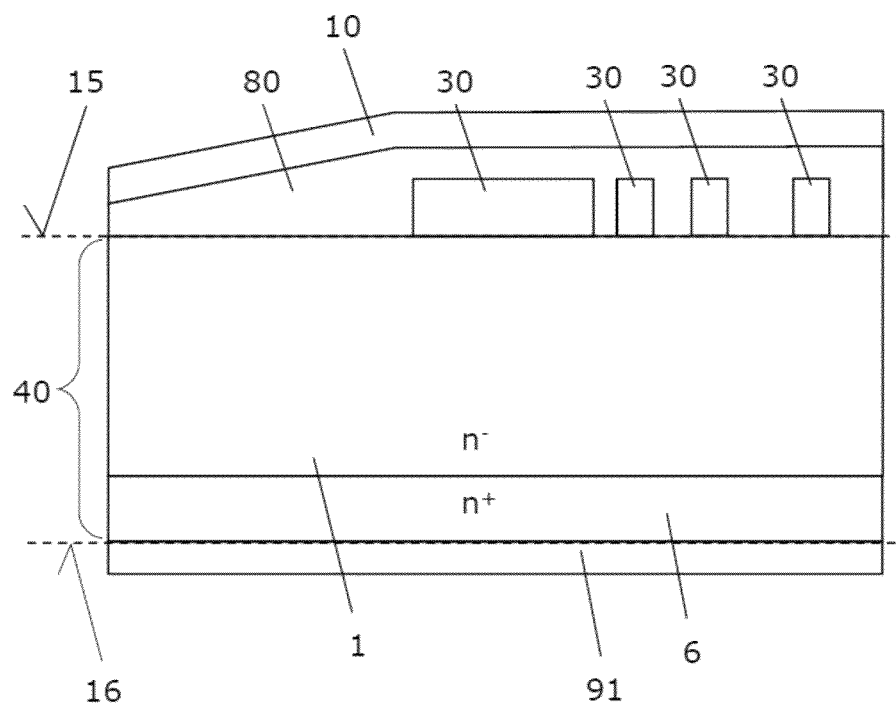

Thereafter, a drain electrode 91 is formed on lower surface 16 and a field plate 10 is formed on dielectric region 80, e.g. by depositing of a metal or a highly doped polysilicon. Field plate 10 is insulated from semiconductor body 40. The resulting semiconductor structure 207 is shown in FIG. 16. Typically, semiconductor structure 207 forms an edge termination structure which is arranged in a peripheral area 127 of a power semiconductor device. The manufacturing processes are typically carried out such that the charged regions 30 and/or the dielectric region 80 are shielded against incorporation of hot majority charge carriers generated in the first semiconductor region 1. FIG. 16 describes a MOSFET by way of example of the connection terms. In the case of an IGBT or a diode, the metallization 91 formed on the lower surface 16 can be operated as a collector electrode or a cathode electrode.

Figure 17:
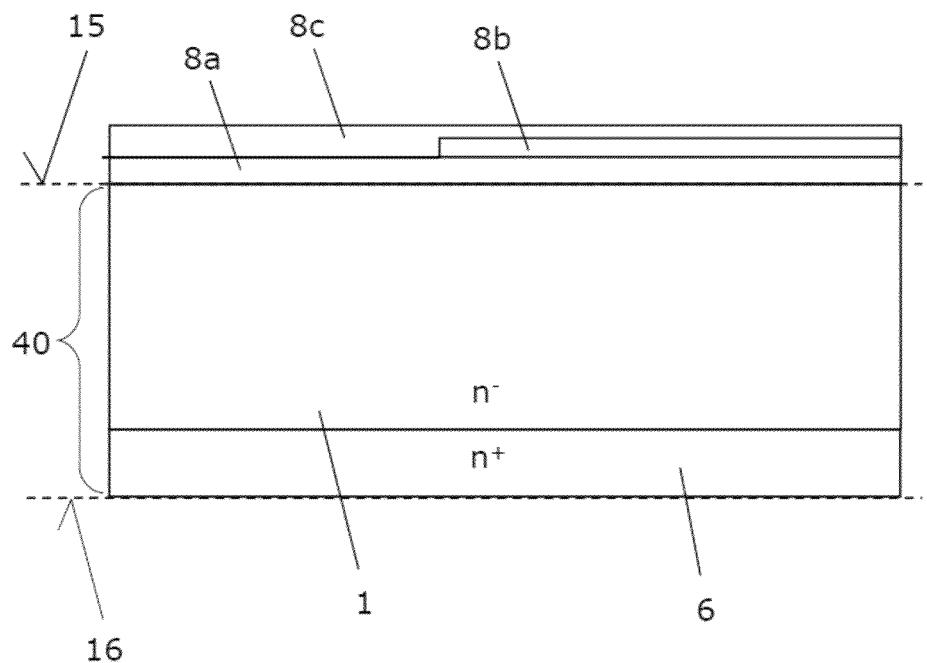

The semiconductor device 207 illustrated in the embodiment of FIG. 17, is similar to the semiconductor device 207 of FIG. 13. However, layer 8b is only partly deposited on layer 8a. This may e.g. be achieved by depositing a structured anti-adhesive layer for the material of layer 8b prior to the ALD process of forming layer 8b.

Figure 18:
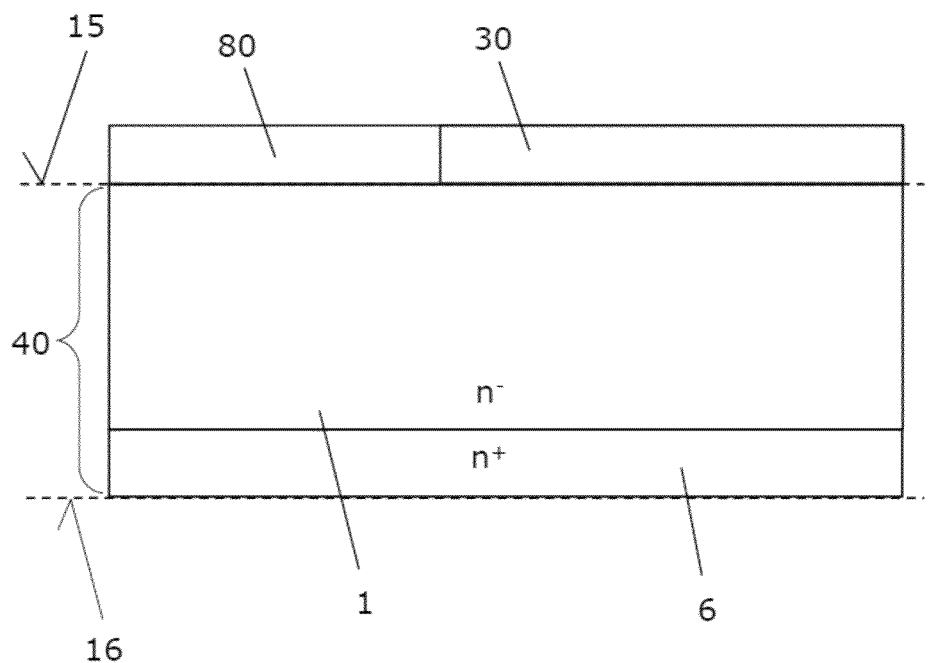

Thereafter, thermal steps are carried out as has been explained with reference to FIG. 14. In so doing, two dielectric regions 30, 80 with different charge carrier density per area are formed on main surface 15. Charged dielectric region 30 has typically a higher charge carrier density per area than dielectric region 80. The resulting structure 207 is shown in FIG. 18.

Figure 19:
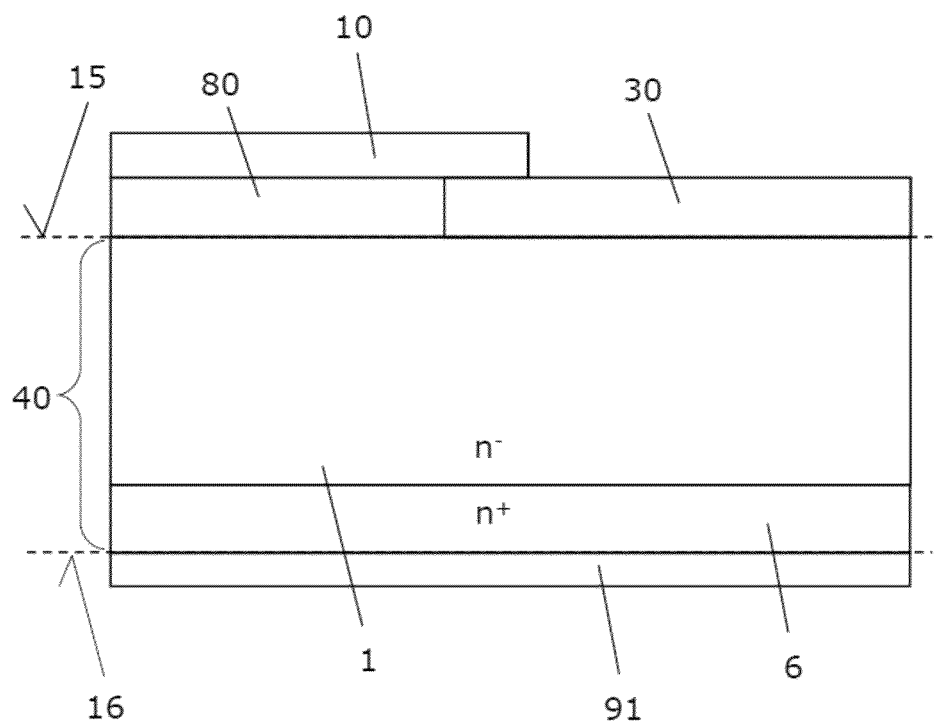

Thereafter, a field plate 10 is formed on dielectric region 80 and a drain electrode 91 is formed on lower surface 16. Field plate 10 is insulated from semiconductor body 40. The resulting semiconductor structure 207 is shown in FIG. 19. Typically, semiconductor structure 207 forms an edge termination structure which is arranged in a peripheral area of a power semiconductor device.

In other embodiments, charged dielectric region is formed in a lower portion of a trench and a dielectric region 80 is formed in an upper portion of the trench. The processes of forming charged dielectric region 30 and dielectric region 80 may be carried out similarly, as explained with reference to FIGS. 11 to 19 but are carried out on a trench surface. After forming a trench by etching in semiconductor region 1, a conformal first dielectric layer is formed on semiconductor region 1, at least in the trench. Thereafter, a second layer is formed on the first dielectric layer by atomic layer deposition in a lower portion of the trench. Subsequently, a second dielectric layer is formed on the second layer such that the charge type of the fixed charges is equal to the charge type of the majority charge carriers of the first semiconductor region 1. Thereafter, thermal processes are carried out to form a charged dielectric region 30 and a dielectric region 80 in the lower portion and upper portion, respectively, of the trench.

Thereafter, an electrode structure is formed at least in the lower portion of the trench, such that the electrode structure is insulated from the semiconductor body by the charged dielectric region 30. The electrode structure may be a field plate or a gate electrode having a lower portion which is configured to operate as a field plate.

Typically, the trench is formed in an active area of a power semiconductor device. The charge carrier density per area is chosen such that at least the charged dielectric region 30 is shielded against incorporation of hot majority charge carriers generated in the first semiconductor region when the semiconductor device is operated in an avalanche mode. Accordingly, the semiconductor device is protected against hot charge carrier induced device degradation.

It goes without saying, that the charged dielectric region 30 on the trench may also be formed as a stack of different dielectric layers which include fixed charges at or close to an interface between the stack of different dielectric layers.

Further, p-type body contact regions, p-type body regions, n-type source regions may be formed after or prior to forming charged layer 8.

Thereafter, a source metallization in contact with the source regions and the body contact regions is typically formed by physical vapor deposition (PVD) and/or electroplating.

Figure 20:
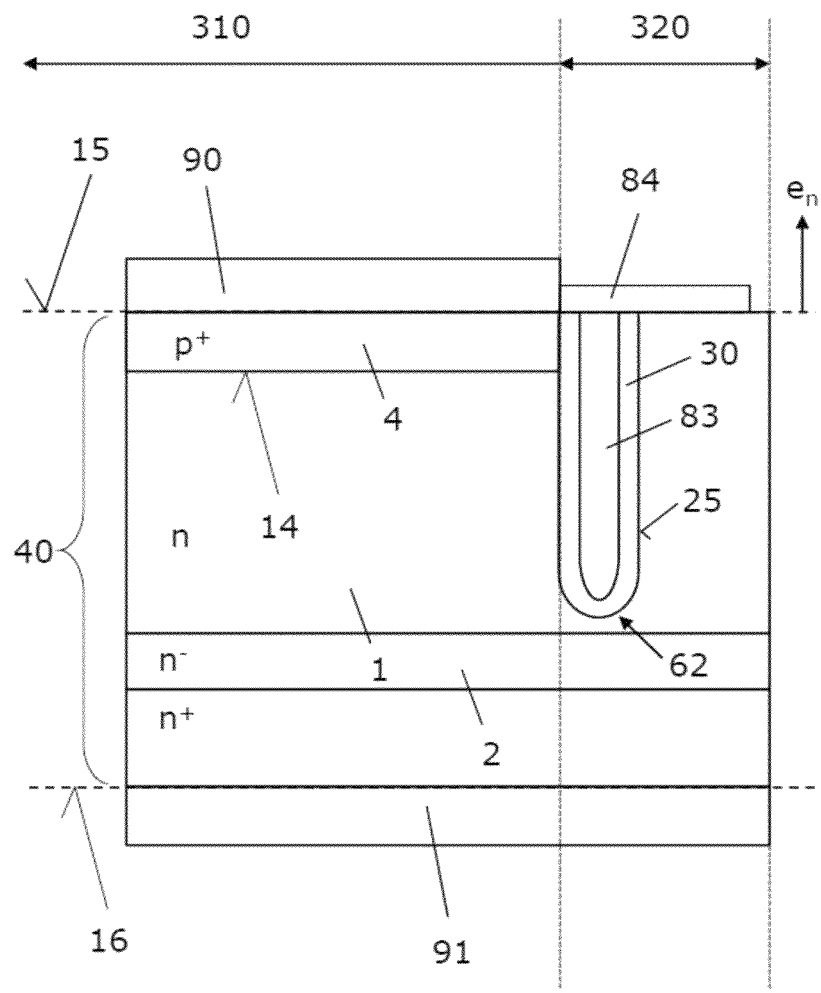
FIG. 20 schematically shows a vertical cross section of a vertical semiconductor device according to one or more embodiments.

FIG. 20 shows an embodiment of a vertical power semiconductor device 307 in a section of a vertical cross section.

In the section of FIG. 20, only a peripheral area or edge area 320 with an exemplary edge termination and an adjacent active area 310 is represented. Typically, a further edge area 320 is also provided to the left of the active area 310. For example, the edge area 320 may be arranged running around the active area. The adjacent active area 310 of the semiconductor body 40 typically contains a plurality of transistor structures and/or diode structures, for example a plurality of field effect transistor cells, as explained with reference to FIG. 1. Typically, a first semiconductor region 1 of the n type, which may form a drift region 1 in the active area 310, reaches the main surface 15 in the peripheral area 320. At least in the active area 310, a pn junction 14 is arranged between the first semiconductor region 1 and the main surface 15. The pn junction 14 of the semiconductor device 307 is formed between the first semiconductor region 1 and a fourth semiconductor region 4 of the p type. In the active area 310, the semiconductor region 4 may, for example, form a body region or an anode region. Typically, the fourth semiconductor region 4 is in ohmic contact with a metallization 90, which may form a source electrode or an anode metallization. The metallization 90 may be arranged on the main surface 15 and form there in ohmic contact with the fourth semiconductor region 4.

As FIG. 20 further illustrates, the pn junction 14 may extend parallel to the main surface 15. By analogy with the explanation with reference to FIG. 2, the first semiconductor region 1 is completely or partially depleted during a blocking mode in the case of the semiconductor device 307 too. In order to ensure a high blocking voltage in blocking mode, an edge termination structure is provided in the peripheral area 320.

According to an embodiment, the edge termination structure includes a vertical trench 62, which in the peripheral area 320 extends from the main surface 15 into the first semiconductor region 1 and which includes a dielectric layer 30 with fixed negative charges, which in the vertical direction is arranged both below and above the pn junction 14. Typically, the trench 62 adjoins the pn junction 14. The concentration of the fixed negative charge carriers may be chosen, for example, substantially independently of the vertical distance from the main surface 15. For example, as illustrated in FIG. 20, the dielectric layer 30 along the side walls of the trench 62 and the bottom of the trench may be configured as a layer of substantially the same thickness with a constant negative charge carrier density per area.

In comparison with lateral edge terminations, such as for example field rings, field plates or edge terminations, which work with a lateral variation of a dopant concentration (VLD or "variation of lateral doping"), the edge termination structure of the semiconductor device 307, like other edge terminations with a vertical trench, manages with a much lower space requirement.

Typically, the space requirement for a given blocking capability is reduced by more than a factor of 2, or even 5, with respect to lateral edge terminations with field plates or field rings or VLD terminations. In comparison with known vertical trenches that are used as an edge termination and are filled with an insulator, for example with silicon oxide, the edge termination structure of the semiconductor device 307 is however much more robust with respect to positive surface charges, since they can be at least partially compensated as and when required by the fixed negative charges. Positive surface charges can indeed in principle also be compensated by an additional p-doped layer in the area of the vertical trench. The doping dose introduced thereby must however be set relatively exactly and can only compensate for surface charges up to a certain degree, since they fluctuate from wafer to wafer and also over the wafer. It may also be disadvantageous that this p-doped region can inject free charge carriers when it is connected to the cathode potential. This may adversely influence the robustness when turning off the device.

According to an embodiment, the vertical trench 62 is completely covered with a dielectric covering 84, for example a silicon nitride covering. This allows contamination of the trench 63 from the outside to be avoided. It permits a high long-term stability of the edge termination structure of the semiconductor device 307.

According to a further embodiment, a charge carrier density per area of the fixed negative charges of the dielectric layer 30 decreases step-wise or continuously with increasing vertical distance from the main surface 15. As a result, an edge termination structure with a charge carrier concentration of the fixed negative charges that varies in the vertical direction is provided. This acts in a way comparable to a VLD edge termination folded depth-wise. Consequently, even a relatively wide spread or certain drift of the surface charge during the operation of the semiconductor device 307 does not lead to a reduction of the blocking capability, or only to a small reduction. The gradient of the fixed negative charge in the vertical direction is thereby typically adapted to the expected spread of the surface charge. In addition—by contrast with edge terminations in which dopants have been introduced into the semiconductor area of the trench—an injection of free charge carriers from the trench 62 can be ruled out, and consequently the robustness of the edge termination during turning-off operations can be increased.

Typically, the dielectric layer 30 consists of an aluminum-doped silicon oxide or an aluminum-doped silicon oxynitride. The concentration of the fixed negative charges can be set and/or varied exactly and within wide ranges by means of the aluminum doping. This is explained in more detail with reference to FIGS. 29 to 32. However, it is also possible to use a plurality of layers with fixed negative charge carriers one on top of the other, optionally separated from one another by uncharged dielectric layers.

In further embodiments, the dielectric layer 30 consists of at least two layers adjacent to one another of different dielectrics, for example a silicon oxide layer and a silicon nitride layer, with fixed negative interface charges at the respective interfaces between the layers adjacent to one another.

According to a further embodiment, a cavity 83 is arranged in the trench 62, for example centrally in the horizontal direction. This allows a mechanical stress caused by the semiconductor-dielectric interface 25 to be at least reduced.

Figure 21:
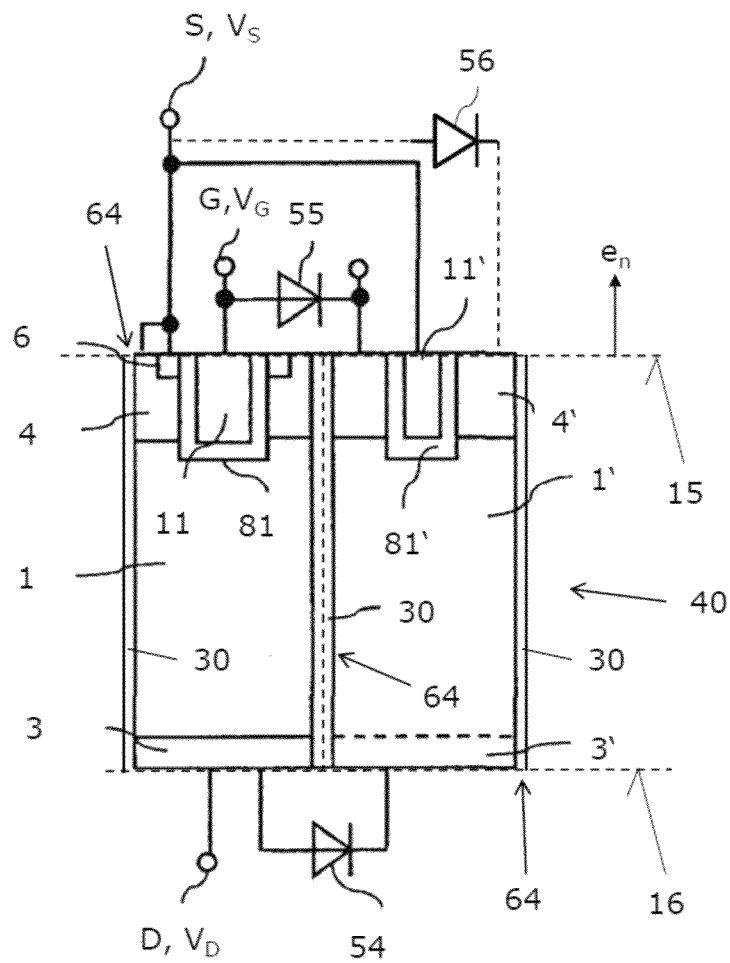
FIG. 21 schematically shows a vertical cross section of a vertical semiconductor device according to one or more embodiments.

FIG. 21 shows an embodiment of a vertical semiconductor device 407 in a section of a vertical cross section. Typically, the semiconductor device 407 is a power semiconductor device. For these embodiments, the section of FIG. 21 corresponds to only one unit cell of the multitude of unit cells represented in the active area of the semiconductor device 407. The semiconductor device represented in FIG. 21 by way of example may be operated as a so-called TEDFET ("Trench Extended Drain Field-Effect Transistor"). The semiconductor device 407 includes for this purpose a conventional MOS transistor structure, represented in the left half, with a drift region 1, which is arranged between a drain region 3 and a body region 4. The body region 4 is arranged between the drift region 1 and a source region 6. The MOS transistor structure also includes a gate electrode 11, which is arranged alongside the body region 4 and is separated from the body region 4 and from the drift region 1 by a gate dielectric 81, i.e. an insulated gate electrode which is adjacent to the body region 4 and the drift region 1. The gate electrode 11 extends in the body region 4—separated by the gate dielectric 81—from the source region 6 at least up to the drift region 1 and serves for controlling a conducting channel (not shown in FIG. 21) in the body region 4 between the source region 6 and the drift region 1. In the example according to FIG. 21, the MOS transistor structure has a vertical trench transistor structure, in which the gate electrode 11 is arranged in a trench which extends in a vertical direction of the semiconductor body 40, in which the MOS transistor structure is integrated. This however is merely an example. The MOS transistor structure may also be realized with a planar gate electrode. Apart from the MOS transistor structure, the semiconductor device 407 includes a drift control region 1', which is arranged horizontally adjacent the drift region 1 and is dielectrically insulated from the drift region 1.

According to an exemplary embodiment, the semiconductor device includes a dielectric layer 30 with fixed charges of the charge type of the majority charge carriers of the adjacent drift region 1. The dielectric layer 30 with fixed charge carriers also adjoins the body region 4 and the drift control region 1'. Typically, the dielectric layer 30 forms a so-called drift control region dielectric or accumulation dielectric 30.

The task of the drift control region 1' is to control a conducting channel in the drift region 1 along the accumulation dielectric 30 when the MOS transistor structure is in an on state, or activated in a conducting manner. The drift control region 1' therefore serves for reducing the turning-on resistance ("on-resistance") $R_{ON}$ of the entire transistor device.

Unlike in the case of traditional MOS transistors, the drift region 1 on this semiconductor device may be n-doped or p-doped (independently of the type of MOS transistor structure). If, for example, in the case of an n-conducting MOS transistor structure, the drift region 1 is n-doped, an accumulation channel forms along the drift control region dielectric 30, which is controlled by the drift control region 1'. If, in the case of an n-conducting MOS transistor structure, the drift region 1 is p-doped, an inversion channel forms along the accumulation dielectric 30 in the drift region 1 when the device is in the on state. Like a conventional MOS transistor, this device is in the on state when a voltage $(V_S, V_D)$ is applied between the source and drain regions 6, 3 or the source and drain terminals S, D, and if a suitable electric potential $(V_G)$ is applied to the gate electrode 11, which brings about a conducting channel in the body region 4 between the source region 6 and the drift region 1. In the case of an n-conducting MOS transistor structure, the voltage $(V_{D\_} V_s)$ to be applied between drain D and source S in order to transfer the device into its on state is a positive voltage and the gate potential $V_G$ is a positive potential with respect to the source potential $V_S$. If the transistor device 407 is in its on state, charge carriers are required in the drift region 1 in order to bring about the accumulation or inversion channel along the accumulation dielectric 30 in the drift region 1. In a transistor device 407 with an n-conducting MOS transistor structure, p charge carriers (holes) are required in the drift control region 1' in order to bring about this conducting channel. These charge carriers are only required in the drift control region 1' when the device is in its on state. When the device is in its blocking state, the charge carriers are removed from the drift control region 1', and—in a way corresponding to in the drift region 1—a space-charge zone or depletion zone forms in the drift control region 1'. In this connection, it should be pointed out that the drift control region 1' is of the same conduction type as the drift region 1, or may be of a complementary conduction type.

The drift control region 1' may be coupled to the drain region 3 via a rectifier element 54, such as for example a diode. The rectifier element 54 is in this case biased such that discharging of the drift control region 1' to the electric potential $V_D$ of the drain region 3 is prevented when the device is in its on state. In the case of an n-conducting transistor device 407, an anode terminal of the rectifier element 54 is coupled to the drift control region 1', while a cathode terminal is connected to the drain region 3. A further connecting region 3', which is arranged between the drift control region 1' and the rectifier element 54, is optional and is of the same conduction type as the drift control region 1, but typically more highly doped.

In other embodiments, a further insulating region is provided instead of the connecting region 3' or in addition to the connecting region 3', so that the drift control region 1' is completely dielectrically insulated from the drift region 1. The rectifier element 54 is logically connected between the drain electrode D and the lower connecting region 3' and when implemented may also be located at or near the upper main surface 15, in particular outside an edge termination region. In this case, corresponding electrically conductive connections should be provided (not represented).

To provide charge carriers in the drift control region 51 when the component is turned on for the first time, the drift control region 1' may have a terminal region 4', which in the case of an n-conducting device 407 is p-doped, coupled to the gate terminal G. In this case, charge carriers are provided from the gate driver circuit, which during the operation of the transistor device 407 is coupled to the gate terminal G. A diode 55, which is coupled between the gate terminal G and the connecting zone 53, serves the purpose of preventing the drift control region 51 from being discharged in the direction of the gate terminal G. The charge carriers that are removed from the drift control region 1 when the device is blocking are typically stored in a capacitive structure with an electrode 11' separated by means of a dielectric 81' from the drift control region 1' and the terminal region 4' and in contact with the source S, until the device is turned on the next time, the capacitive structure being connected between the source S and the drift control region 1'. Alternatively, and not represented, the charge carriers in the drift control region 1' may also be coupled in by means of other measures, for example by means of an external further contact or by means of another charging circuit, for example from the load circuit. In these cases it is possible to dispense with the diode 55. Alternatively or in addition, a diode 56 may also be connected between the terminal region 4' and the source electrode S, the anode of the diode 56 being in electrically conductive connection with the source electrode S. This further diode 56 may serve the purpose of carrying away from the drift control region 1' leakage current that is thermally generated in the case of blocking, as soon as the potential in the terminal region 4' exceeds the blocking capability of the optional diode 56.

To allow lowest possible forward resistance $R_{ON}$ of the semiconductor device, the pitch p of the cells should be chosen as small as possible. However, with a given density of the fixed positive interface charges $Q_{OX}$, however, this leads to a corresponding reduction of the blocking capability, as will be shown below.

Typically, the accumulation dielectric is formed as a thermal $SiO_2$. This oxidation of the silicon semiconductor body 40 typically leads however to a certain density of fixed positive interface charges $Q_{OX}$ in the lower few nanometers of the thermal oxide adjoining the silicon. With good thermal oxides, the density of fixed positive interface charges $Q_{OX}$ may lie in the range of approximately $1 \ldots 10 \cdot 10^{10}$ elementary charges per $cm^2$. The concentration of elementary charges in a volume or the surface charge density is also referred to below in a simplified form as charges per cm² or charges per cm³.

With a small pitch of the accumulation dielectrics, for example in the case of power semiconductor devices with many cells, the blocking voltage of the device is strongly influenced by the oxide charges. The area-specific charging just through the accumulation dielectrics $Q_{eff}$ is approximately $$Q_{eff} = Q_{OK} \cdot 4 \cdot \frac{t}{p},$$

where t is the vertical extent of the accumulation dielectrics or the depth of the vertical trenches 64 containing the accumulation dielectrics and p is the pitch of the cells. The vertical trenches 64 are typically only approximately 30 nm to approximately 60 nm wide, and extend up to approximately 50 μm deep into the semiconductor body 40. They therefore typically have a high aspect ratio of up to 1000 or more.

Within a cell there are in each case 2 accumulation dielectrics, i.e. 4 interfaces, from which the factor of 4 is obtained in the above formula. As soon as the value $Q_{eff}$ reaches the so-called breakdown charge $Q_{BR}$ of approximately 1.5 10¹²/cm² for silicon, the device can no longer reach the blocking voltage defined by the vertical extent t without further measures.

According to an exemplary embodiment, the drift region 1 is of the n type and fixed negative charges are entrapped in the dielectric layer 30, which can be operated as an accumulation dielectric. This allows positive charges that are entrapped in the thermal oxidation to be compensated as and when required, and thus a high blocking capability of the semiconductor device to be ensured with at the same time low forward resistance $R_{ON}$ by a small pitch of the vertical trenches 64.

Typically, the dielectric layer 30 consists of an aluminum-doped silicon oxide or an aluminum-doped silicon oxynitride, of which the concentration of the fixed negative charges can be set and/or varied exactly and within wide ranges by means of the aluminum doping.

For example, aluminum, for example in the form of $Al_2O_3$ or AlN, may be applied by means of one or more atomic layer depositions to a thermal oxide and subsequent thermal processes at least on the side walls of the vertical trenches 64, which typically extend from the main surface 15 to the back surface 16, which leads to fixed negative charges. The concentration of the fixed negative charges can be set very exactly by means of the number of atomic layer deposition cycles and, in the possible event of an excessive charge density, by additionally covering a defined number of trenches 64 during one or more atomic layer depositions.

After the atomic layer deposition, the fixed negative charges are located at the surface of the thermal oxide. By further subsequent thermal oxidation, the fixed negative charges are further removed from the semiconductor material, but remain stably preserved. Typically, the thermal oxidation is carried out until the dielectric layer 30 has grown together with the fixed negative charges, i.e. the trench 64 is filled. Accordingly, the charge carrier density per area of the fixed negative charges of the dielectric layer 30 in a horizontal plane has a highest value approximately midway between the third semiconductor region 1' and the first semiconductor region 1. The thermal oxidation may, however, also be prolonged, in order to produce a higher oxide thickness on the chip front side or main surface 15. In this case, the buried oxide regions typically do not become any thicker.

It is also possible, for example by means of the choice of precursor molecules, i.e. the starting material of the atomic layer deposition processes, for the charge carrier density per area of the fixed negative charges of the dielectric layer 30 to be set such that it decreases step-wise or continuously with increasing distance from the main surface 15.

Figure 22:
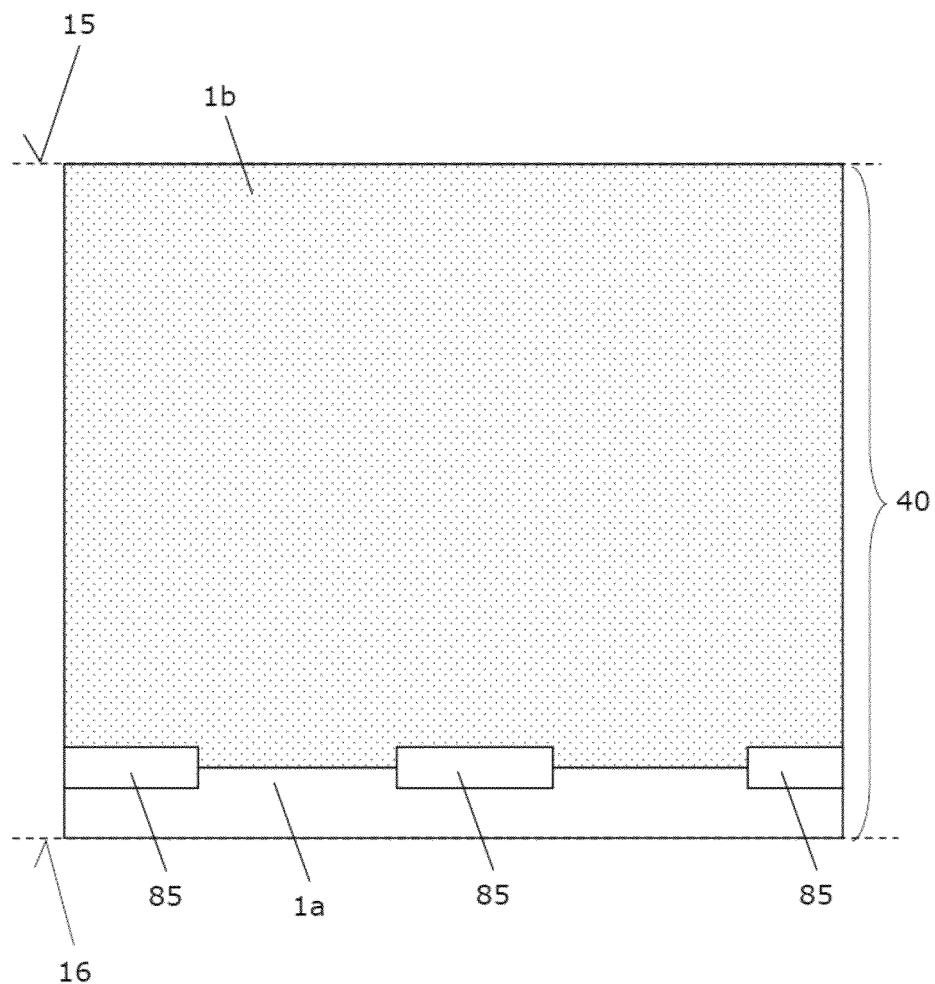
FIGS. 22-28 show manufacturing processes according to one or more embodiments.

FIGS. 22-28 show exemplary processes for the manufacture of a semiconductor device 307, as has been explained with reference to FIG. 21, according to one or more embodiments in vertical sections. Of these, FIG. 22 shows a semiconductor body 40, typically a silicon semiconductor body 40, which extends from a main surface 15 to an opposite surface 16. Oxide webs are embedded in the semiconductor body 40. The structure shown in FIG. 22 may be provided, for example, by generating LOCOS structures 85 on a substrate 1a and subsequent lateral overgrowth by means of a selective epitaxial layer and further optional epitaxial layers to form an epitaxial region 1b. In this case, the doping of the epitaxial layers may be adapted to already suit the semiconductor device that is to be manufactured.

Figure 23:
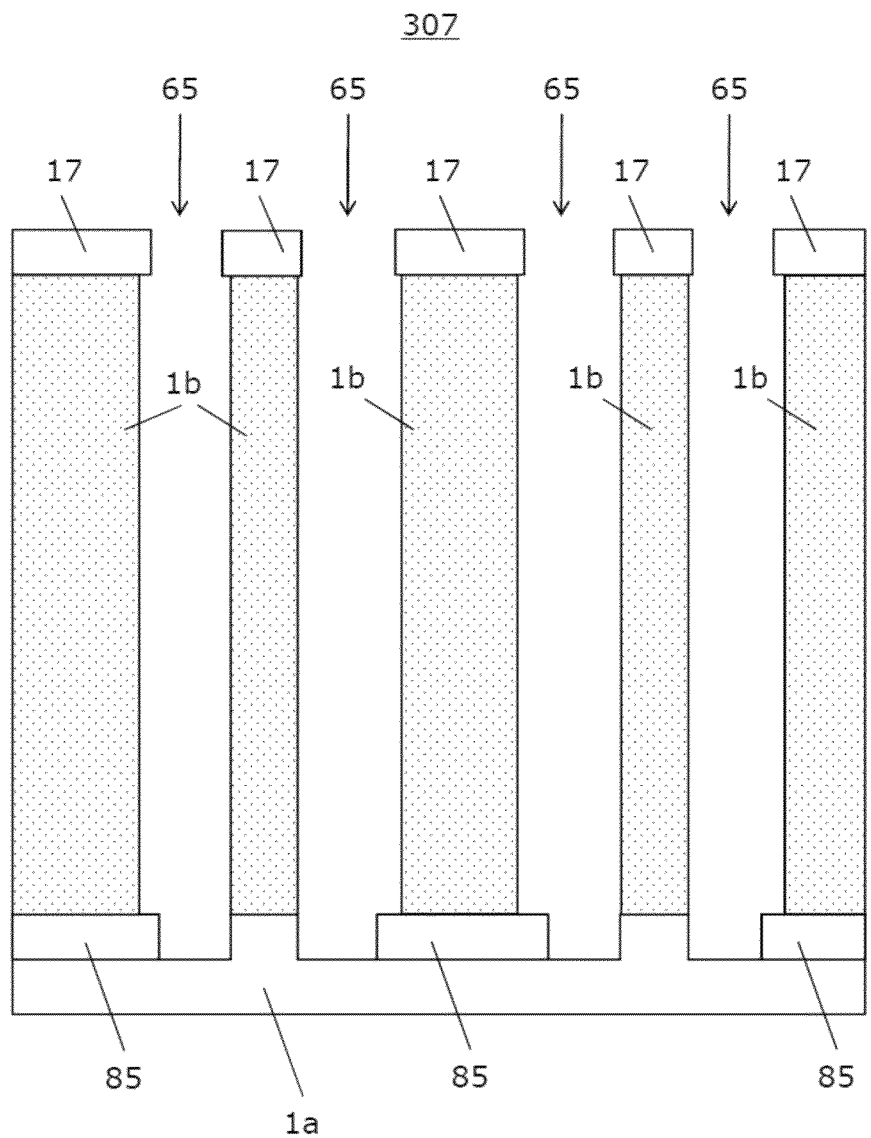

Subsequently, a hard mask 17 is used for etching deep trenches 65, which surround the oxide webs 85 by running around them. The resultant semiconductor structure 307 is shown in FIG. 23.

In the deep trenches 65, a side-wall oxide 18 is generated, for example by means of thermal oxidation and subsequent anisotropic etching, on the bottom of the deep trenches, and is removed again, for example by means of a carbon hard mask, on the semiconductor mesa that is not adjacent the buried oxide webs 85. Then holding marks 95 are additionally etched into the remaining hard mask on the semiconductor mesas that lie above the buried oxide webs 85, and the thin oxide layers on the exposed mesa are removed wet-chemically. The resultant semiconductor structure 307 is shown in FIG. 24.

Figure 24:
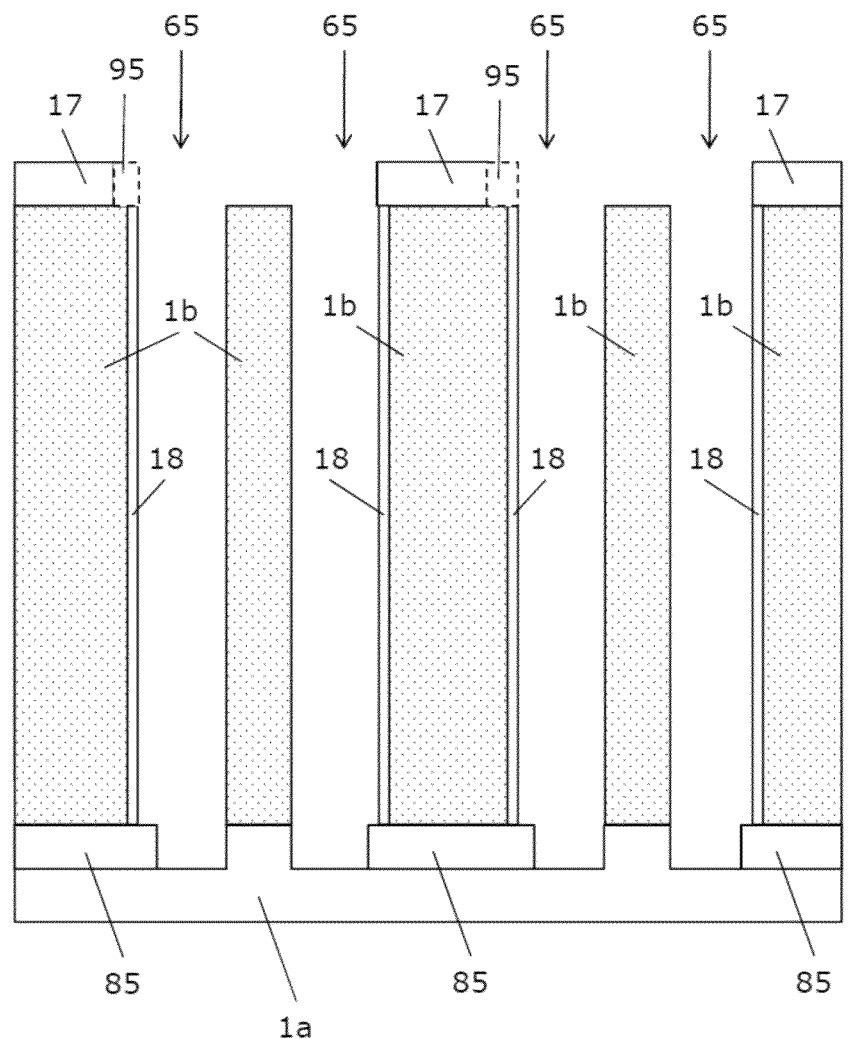

The holding marks 95 represented by dashed lines in FIG. 24 are only local openings in the hard mask and are intended to establish a direct connection between the semiconductor layer 1b via the oxide webs 85 and a later generated semiconductor filling.

Figure 25:
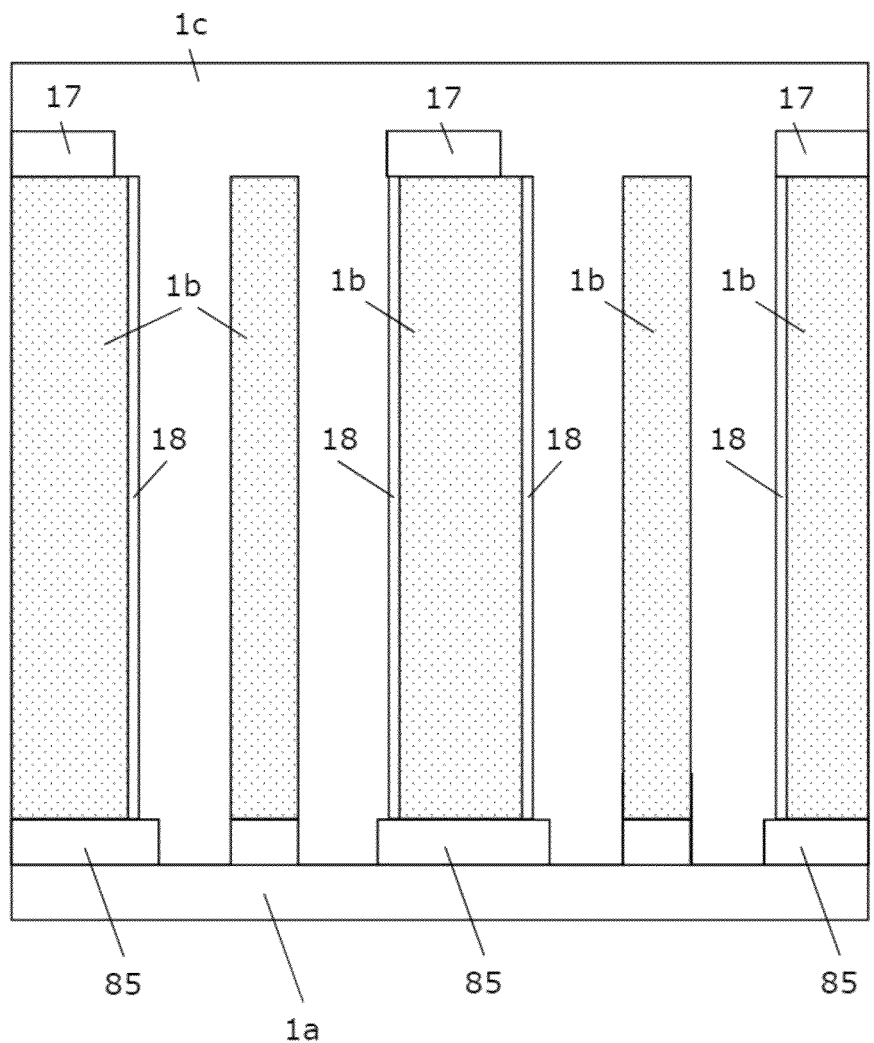

Starting from the oxide-free semiconductor mesas, the deep trenches 65 are filled laterally by an epitaxial process. The process conditions are in this case typically similar to in the case of lateral overgrowth. At the same time, the remains of the hard mask are grown over epitaxially by the holding marks 95, in order to generate a semiconductor filling 1c. The resultant semiconductor structure 307 is shown in FIG. 25.

Figure 26:
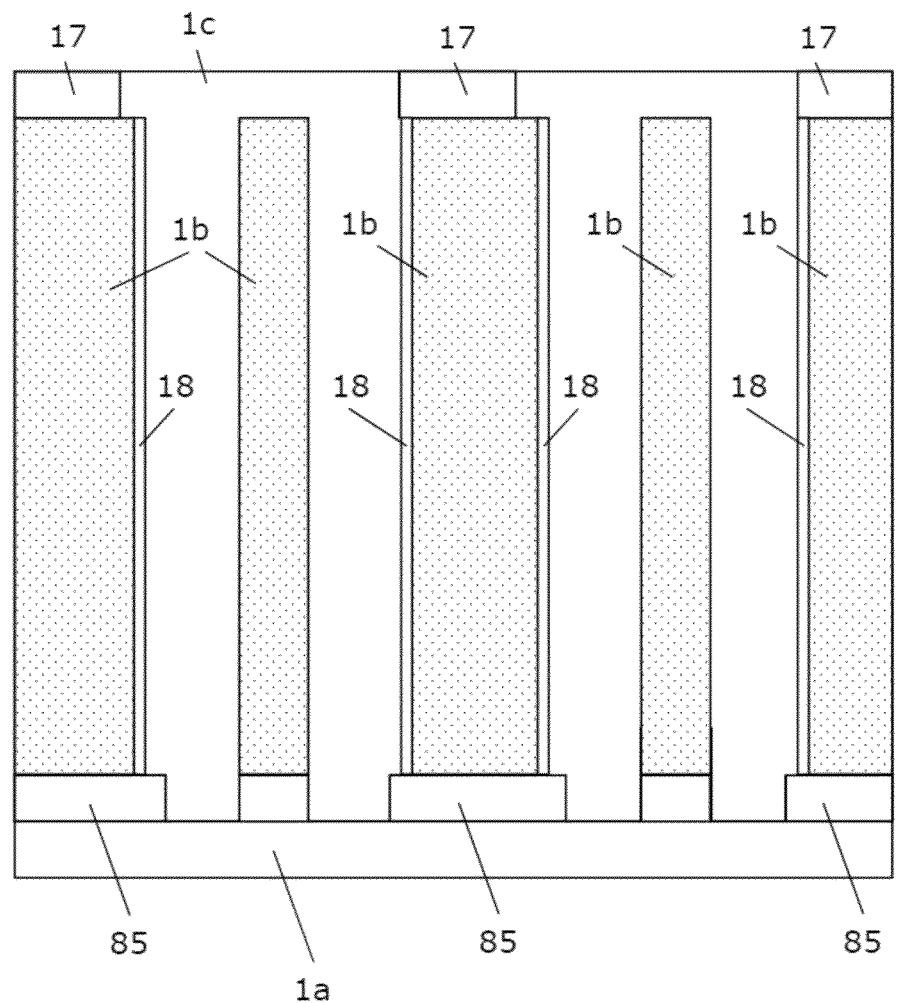

After that, the projecting semiconductor layer 1c can be polished back to the height of the hard mask 17, for example by means of CMP. The resultant semiconductor structure 307 is shown in FIG. 26. Consequently, the hard mask 17, which preferably consists of $SiO_2$ and has a direct connection to the underlying side-wall oxide 18 and the buried oxide webs 85 is exposed.

Figure 27:
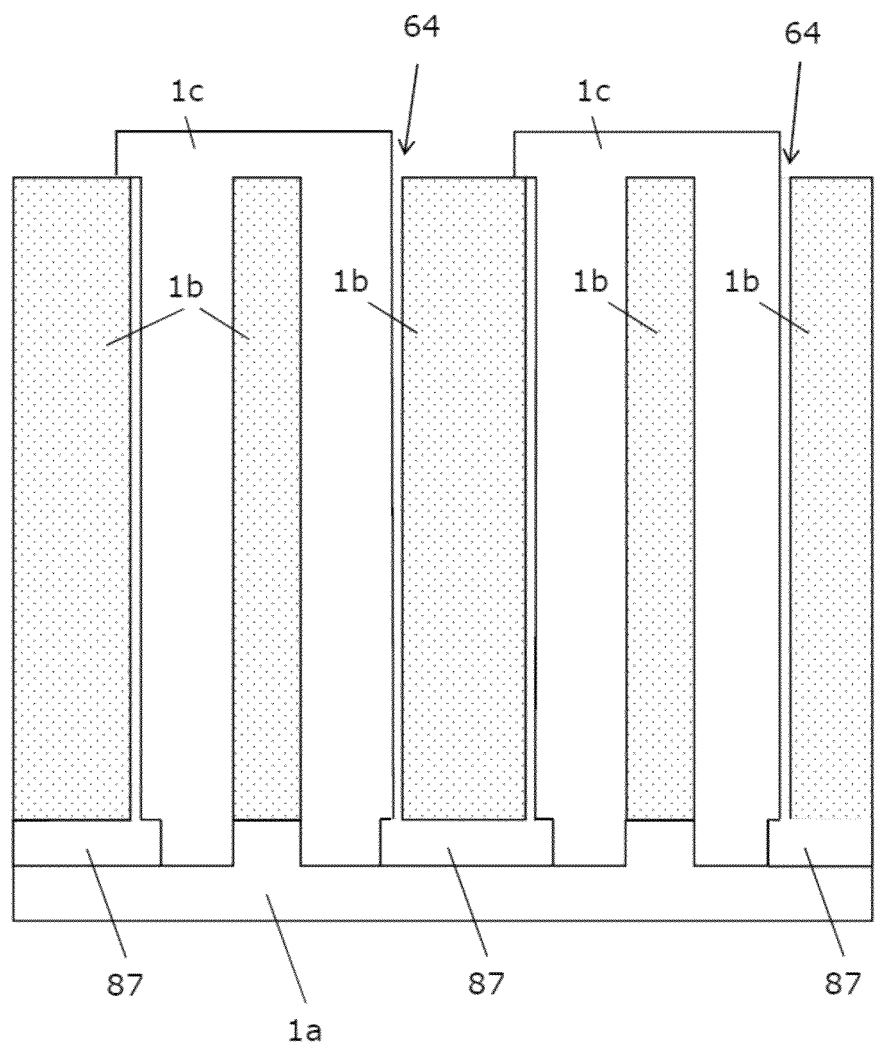

By a wet-chemical etching, for example in HF-containing solutions, in particular highly concentrated (about 50%) HF solution, the hard mask 17, the side-wall oxide 18 and the buried oxide webs 85 can be removed. The resultant semiconductor structure 307 is shown in FIG. 27. The semiconductor regions above the original buried oxide webs are kept sufficiently stable by the Si webs extending from the holding marks 95.

Subsequently, the dielectric layer 30 with fixed negative charges may be generated by thermal oxidations and atomic layer deposition processes. The resultant semiconductor structure 307 is shown in FIG. 27. The generation of the dielectric layer 30 with fixed negative charges is explained in detail with reference to FIGS. 29-35 and may include the generation of an aluminum oxide or aluminum nitride layer on a thermally generated thin oxide, also referred to hereafter as the pad oxide or starting oxide, and further thermal oxidation processes. In this case, cavities 86 may remain in the region of the original buried oxide webs in order to reduce mechanical stresses. The main surface 15 may be leveled by means of a further CMP step, not represented, so that the regions 1b and 1c and the dielectric layers 30 form a continuous surface.

Subsequently, doping steps may take place to generate further semiconductor regions. Typically, this involves forming at least one pn junction, which may adjoin the trench 62. For example, p-doped body regions, body contact regions or anode regions and/or n+-doped source regions may be formed from the main surface 15. It goes without saying that these further semiconductor regions may also be formed at least partially before the forming of the trench 62 or the silicon oxide layer 30 with fixed negative charges.

Subsequently, electrode structures such as gate electrode structures and source electrodes may be generated on or at the main surface 15 and a drain electrode on the opposite surface 16, in order for example to manufacture a semiconductor device 307 that can be operated as a TEDFET.

One particular advantage in this case is that the dielectric layer 30 with fixed negative charges, acting as an accumulation dielectric, in the semiconductor device 307 runs seamlessly around the bottom of the drift control regions 1', and consequently there are no weak points there for dielectric breakdowns.

FIGS. 29-34 show manufacturing processes for vertical trenches 62, which contain a dielectric with fixed negative charges, according to one or more embodiments, in vertical sections. These manufacturing processes may be used not only for the manufacture of edge termination structures, as explained by way of example with reference to FIG. 20, but also for the manufacture of TEDFET structures, as explained by way of example with reference to FIG. 21, and for the manufacture of semiconductor devices with trench electrodes, as explained by way of example with reference to FIG. 1. Furthermore, the manufacturing processes may also be used for the semiconductor devices explained with reference to FIGS. 2 to 10, the atomic layer deposition processes that are explained below then not being performed on trench surfaces but typically on the main surface of the semiconductor body.

Firstly, a semiconductor body 40, typically a silicon semiconductor body 40, with a main surface 15 and a first semiconductor region 1 of the n type, is provided. The first semiconductor region 1 may extend from the main surface 15 to an opposite back surface 16.

Figure 29:
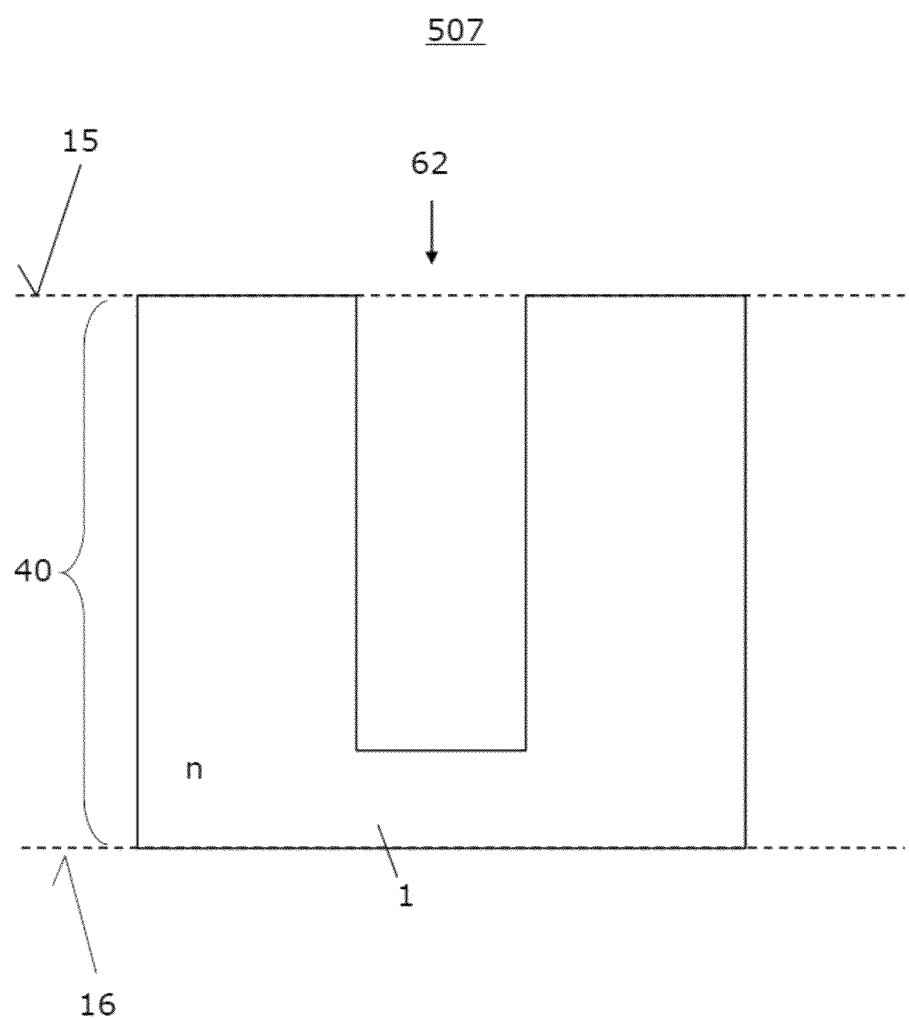
FIGS. 29-35 show manufacturing processes according to one or more embodiments.

After that, at least one trench 62, which extends from the main surface 15 into the first semiconductor region 1, is generated. Typically, the at least one trench 62 is generated by masked etching. The resultant semiconductor structure 507 is shown in FIG. 29. The trench 62 is typically a vertical trench. Depending on the semiconductor device to be manufactured, a multiplicity of trenches 62 may be generated in parallel, for example in the active region of a TEDFET. The trenches 62 may also have a high aspect ratio of up to 1000 or even more. It is also possible, however, for only one trench 62, for example a running-around trench, to be generated in a peripheral area for the manufacture of an edge termination structure. In a further exemplary embodiment, not only is a trench 62 etched into the semiconductor body 40 in the peripheral area but also one or more trenches 62 are etched into it in the active area.

Figure 30:
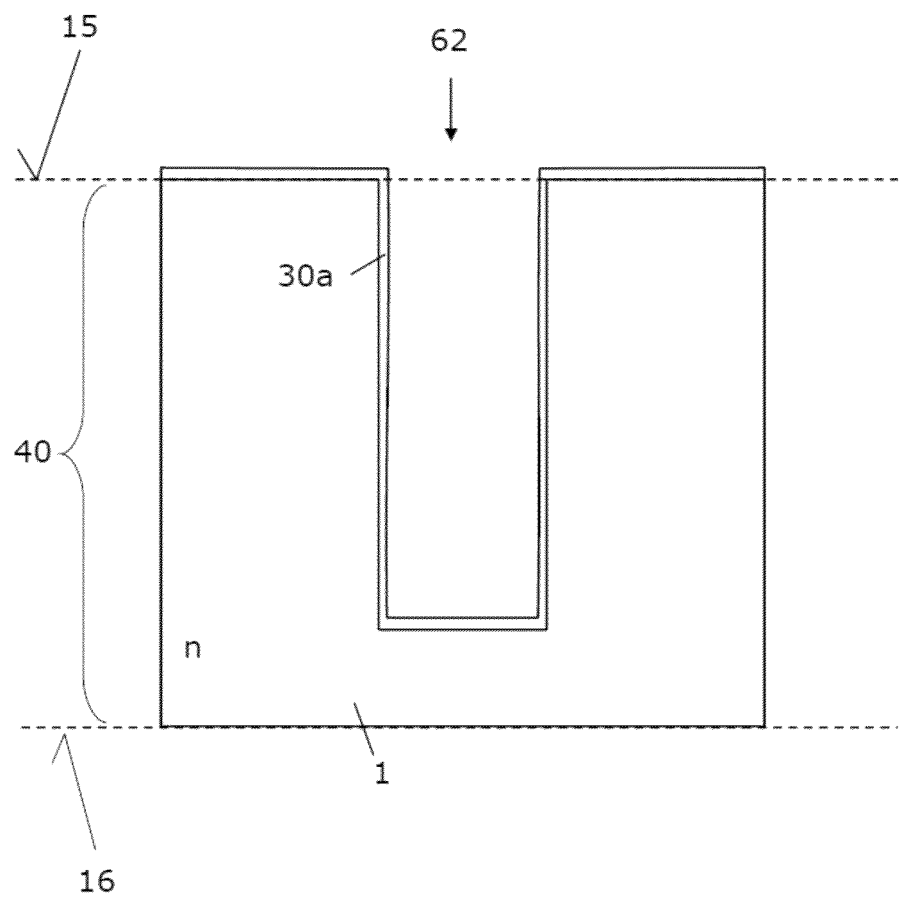

After that, typically an optional thin thermal pad oxide 30a is generated at least on the surface of the trench 62, in order to generate defined and good interfacial states. The resultant semiconductor structure 507 is shown in FIG. 30.

Figure 31:
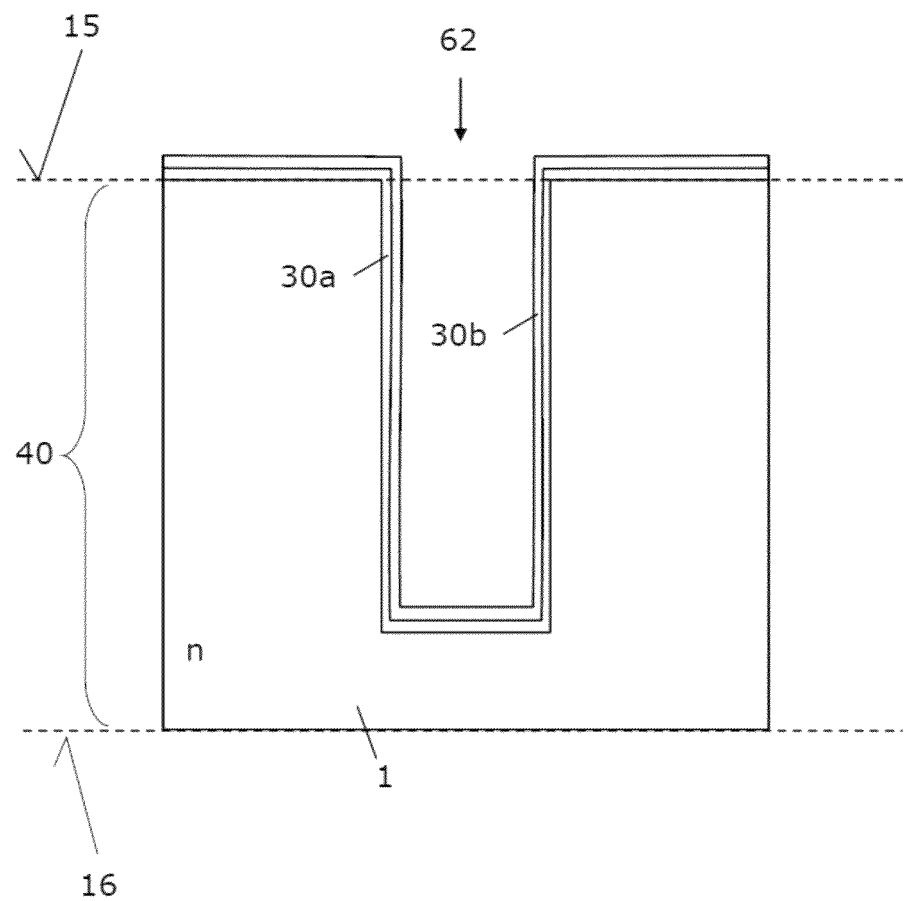

After that, an atomic layer deposition takes place using an organometallic precursor or organometallic starting material on the surface of the trench 62 or the pad oxide 30a. As a result, one or more monolayers 30b of metal organyls is/are formed. The resultant semiconductor structure 507 is shown in FIG. 31. Typically, an aluminum organyl, for example TMA (trimethyl aluminum) is used as the precursor.

The atomic layer deposition makes it possible for the precursor to produce by a first reaction step a covering of the surface on which further precursor molecules can no longer be attached. In the case of TMA, the precursor reacts by splitting off of a ligand (here: a methyl group) and attaching a bond of the central atom (Al) to the surface. The splitting off of the ligands may, for example, take place thermally. The two remaining protruding methyl groups sterically prevent further docking of TMA molecules to the surface. This permits a defined setting of the doping, and consequently of the density of the fixed negative charges.

After a flushing step to remove non-bonded precursor molecules, the remaining ligands can be split off, for example thermally. Depending on the surrounding medium and temperature, this may involve generating an aluminum oxide layer (in oxygen-containing surroundings) or an aluminum nitride layer (under nitrogen gassing). The temperatures in this case typically lie in a range from approximately 700° C. to approximately 1250° C., particularly from approximately 800° C. to approximately 1100° C. In this way, a self-limited entrapment of a controlled Al doping is made possible. The doping dose can be set by the number of atomic layer deposition cycles, in the case of TMA in steps of approximately $2 \ldots 3 \times 10^{11}/cm^2$.

Figure 32:
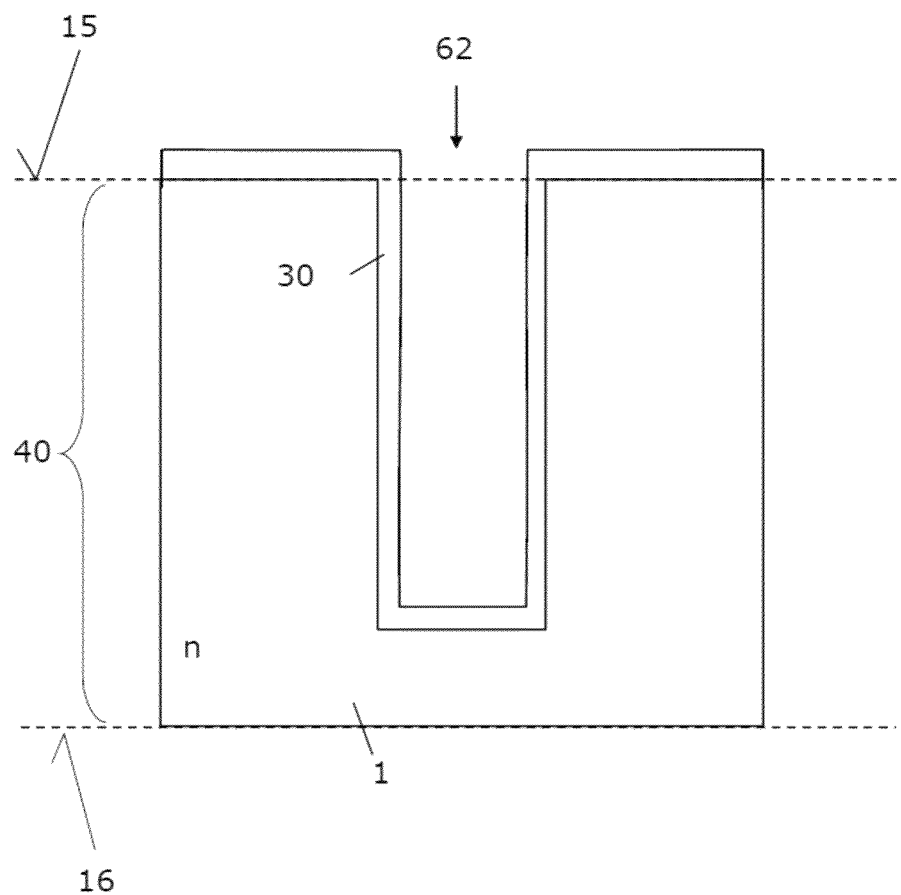

Subsequently, the layer thickness may be increased further by further thermal oxidation, and a metal-doped (aluminum-doped) silicon oxide layer 30 with fixed negative charges formed, temperatures typically lying in a range from approximately 700° C. to approximately 1250° C., particularly from approximately 800° C. to approximately 1100° C. The resultant semiconductor structure 507 is shown in FIG. 32.

The dose of the entrapped charge typically lies in the range of the breakdown charge of silicon. When TMA is used as the precursor, this corresponds to approximately 5 to approximately 25 atomic layer deposition cycles. TMA is particularly well suited as the precursor when a homogeneous charge distribution over the trench depth is sought, because it constitutes a relatively small molecule. Trenches 62 with a width that is not too small or an aspect ratio, i.e. the ratio of depth to width of the trench 26, that is not too high are likewise favorable for this purpose.

According to a further exemplary embodiment, a density of the fixed negative charges that decreases in the vertical direction is set in the trench 62 by means of an atomic layer deposition with varying doping. To implement this vertically varied doping (VVD), the atomic layer deposition process described above is performed, for example, in a trench 62 that is as narrow as possible, for example in the peripheral area of the semiconductor device. The trench 62 thereby has a high aspect ratio, for example greater than approximately 50. The use of a larger precursor molecule instead of the relatively small TMA may particularly lead to a depletion of the precursor with increasing trench depth on account of a limitation of the diffusion. Consequently, the amount of aluminum deposited can be varied over the trench depth by depletion. Alternative, and somewhat more voluminous, precursors for the aluminum doping are, for example, materials of the type tris(dialkylamino) aluminum such as TDEAA (tris(diethylamino) aluminum or tris(diisopropylamino) aluminum (Al (DIA)3, 2) and tris(bis(trimethylsilyl)amino) aluminum (Al (TMSA)3).

Figure 33:
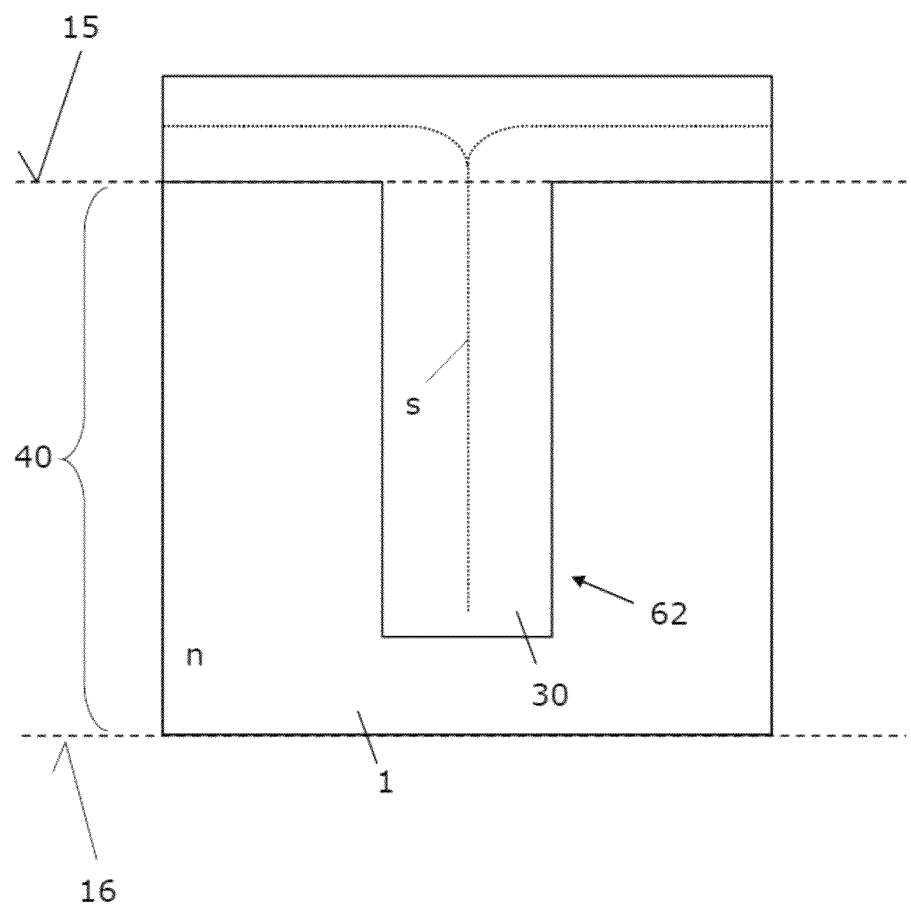

The thermal oxidation can be continued until the trench 62 is at least completely filled. The resultant exemplary semiconductor structure 507 is shown in FIG. 33. In the case of complete oxidation of the trench 62, the fixed negative charges are arranged symmetrically in the trench 62, which is represented by the dotted curve 's' in FIG. 33. The fixed negative charges act uniformly on both interfaces between the oxide and the semiconductor material. Consequently, very good compensation for positive fixed charges is made possible.

In the manufacture of a TEDFET, the charge compensation in the area of the lowly doped drift region or drift control region is important. In the area of an optional highly doped field stop region, i.e. also below the drift control region, the interfacial charge of the oxide is uncritical, since here there is no longer any high electric field in blocking mode.

Figure 34:
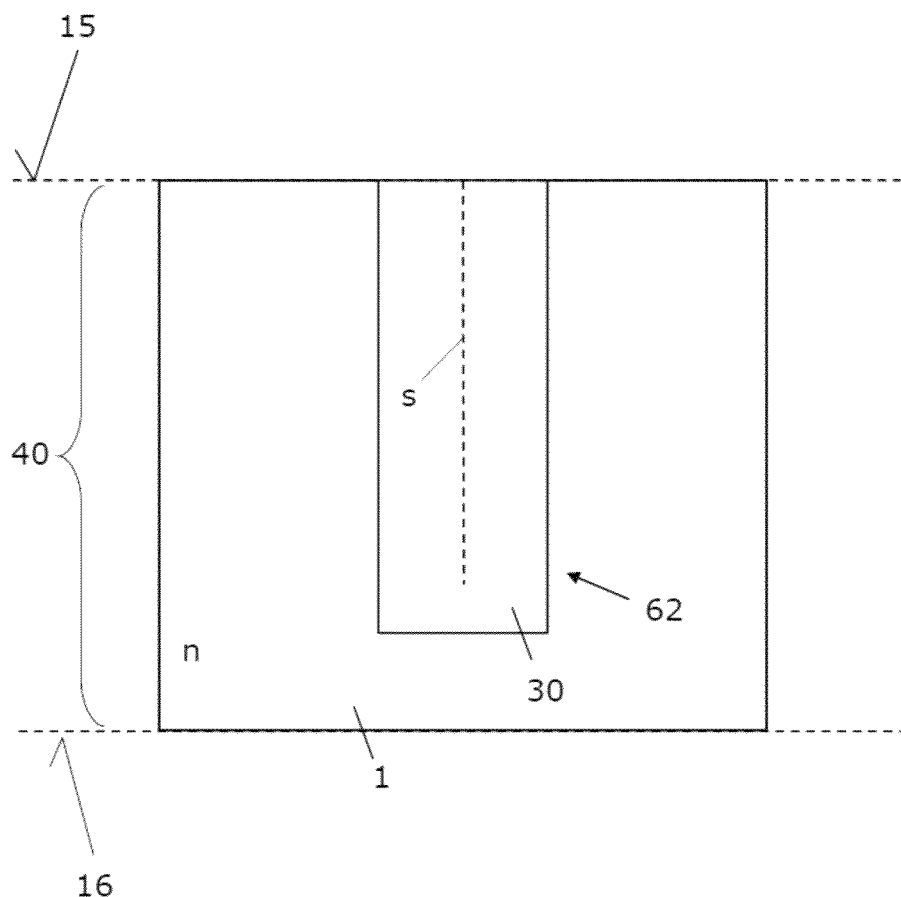

After that, the silicon oxide layer 30 with fixed negative charges may be removed by planarizing or etching on the main surface 15. The resultant semiconductor structure 507 is shown in FIG. 34.

The trench 62 may then be provided with a passivation layer, for example of a polyimide or benzo cyclo butane (BCB), in order to prevent external contamination with charge carriers.

As an alternative to the complete filling of the trench 62 by thermal oxidation, the trench 62 may also be completely or partially filled by a CVD process, any voids possibly remaining in the trench 62 being able to contribute to the reduction of mechanical stresses.

Figure 35:
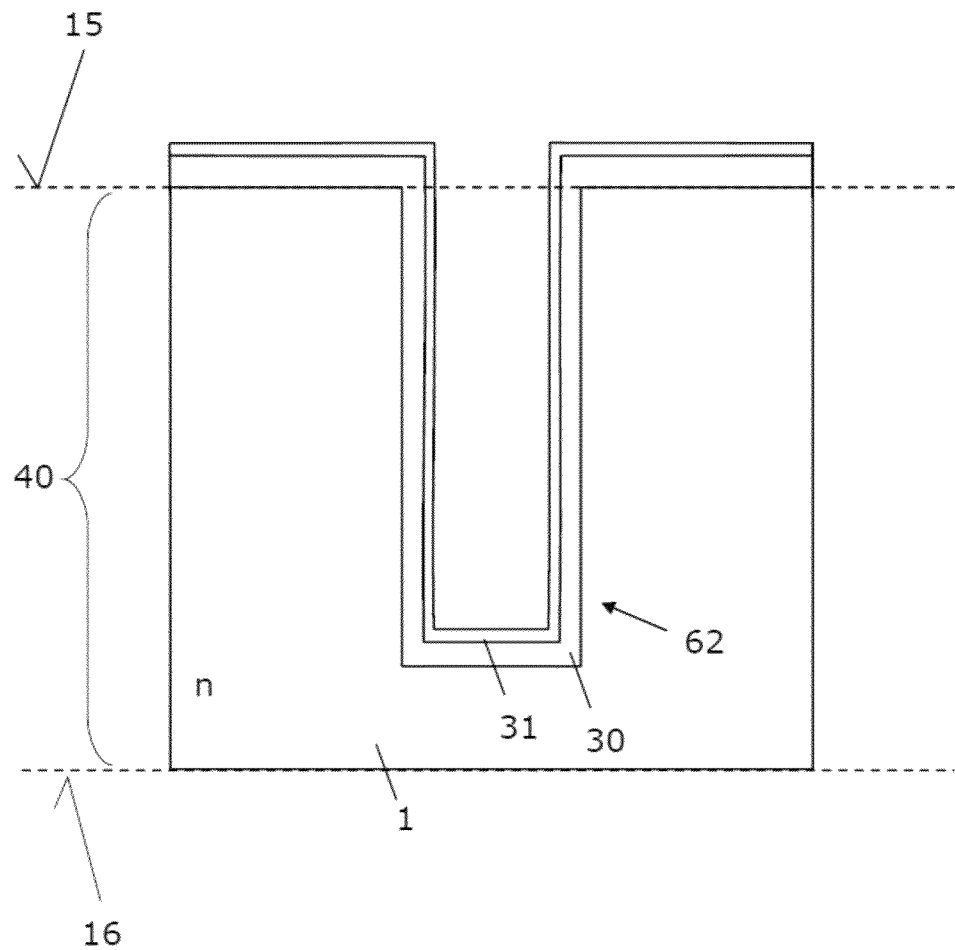

According to a further embodiment, starting from the semiconductor structure 507 that is illustrated in FIG. 30, one or more further atomic layer deposition processes with subsequent thermal oxidation is/are performed to generate one or more additional silicon oxide layers 31 with fixed negative charges on the silicon oxide layer 30 with fixed negative charges. A resultant exemplary semiconductor structure 507 is shown in FIG. 35. In this way it can be achieved that the charge carrier density per area of the fixed negative charges in the trench 62 decreases step-wise with increasing distance from the main surface 15 or trench depth.

Subsequently, the trench 62 may be completely filled and/or these layers 30, 31 removed again from the main surface, for example by thermal oxidation.

Figure 28:
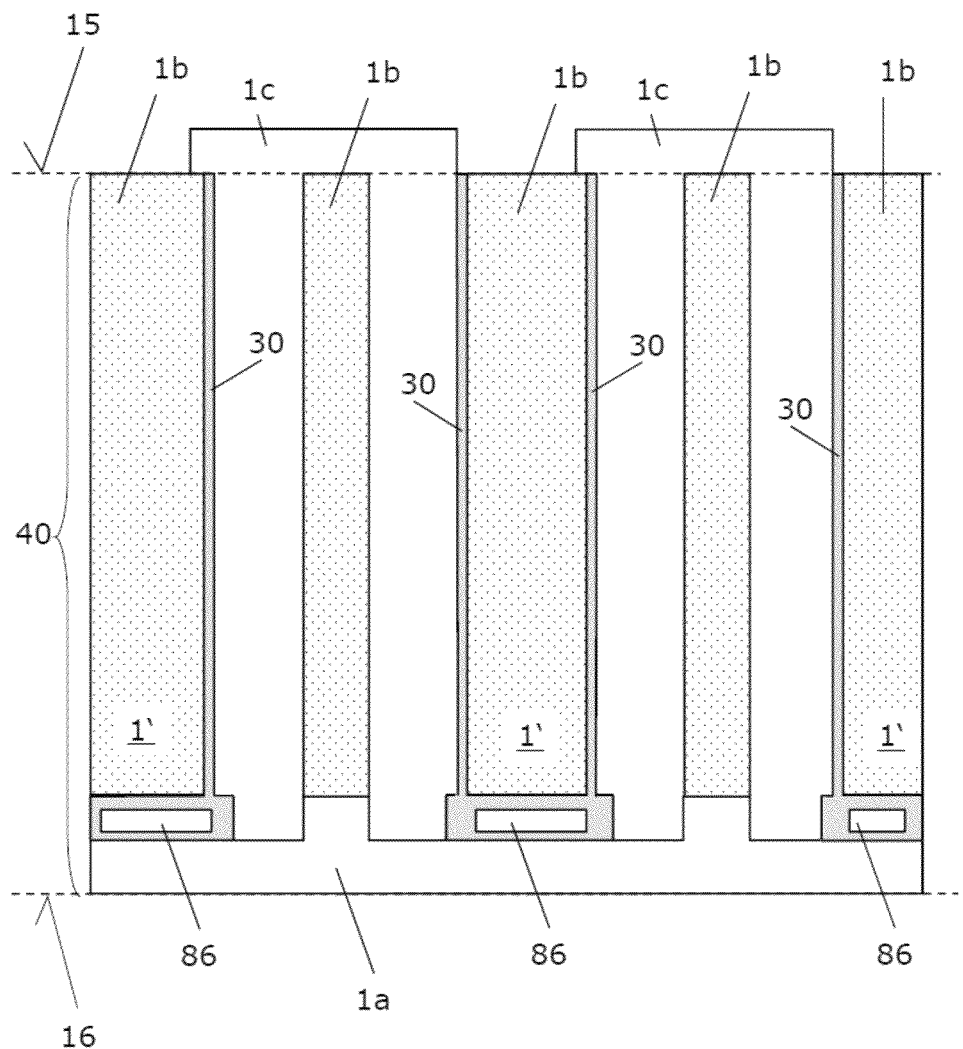

Subsequently, as explained in detail with reference to FIG. 28, doping steps may follow to generate body regions and source regions and the generation of electrode structures, in order for example to manufacture a TEDFET with a dielectric layer with fixed negative charges and/or vertical edge termination, acting as an accumulation oxide, with a dielectric layer 30 with fixed negative charges arranged in the vertical trench 62. For these applications, the charge carrier density per area of the fixed negative charges parallel to the main surface 15 is typically set by means of the atomic layer deposition such that positive fixed charges can be compensated for example by thermal oxidation processes. Typically, the charge carrier density per area of the fixed negative charges for these applications is approximately $10^{11}/cm^2$ or even somewhat less. For example, a good thermal oxide may have approximately $3\ldots 7\times 10^{10}/cm^2$ of positive charges per interface with the silicon semiconductor, which are almost compensated, completely compensated or even slightly overcompensated by the corresponding fixed negative charges. For example, the dielectric layer 30 may also have a negative net charge.

On the other hand, the methods explained with reference to FIGS. 29 to 35 also allow the manufacture of semiconductor devices of which the dielectrics are protected by the entrapment of fixed negative charges with respect to degradation caused by hot charge carriers during the operation of the device. These devices have been explained with reference to FIGS. 1 to 10. For these applications, the charge carrier density per area of the fixed negative charges is typically set greater than $10^{11}/cm^2$, in order to ensure sufficiently good protection from degradation of the dielectrics, while the overall charge in conjunction with the dopant charge should not become too high, in order not to put at risk the blocking capability of the device.

Figure 36:
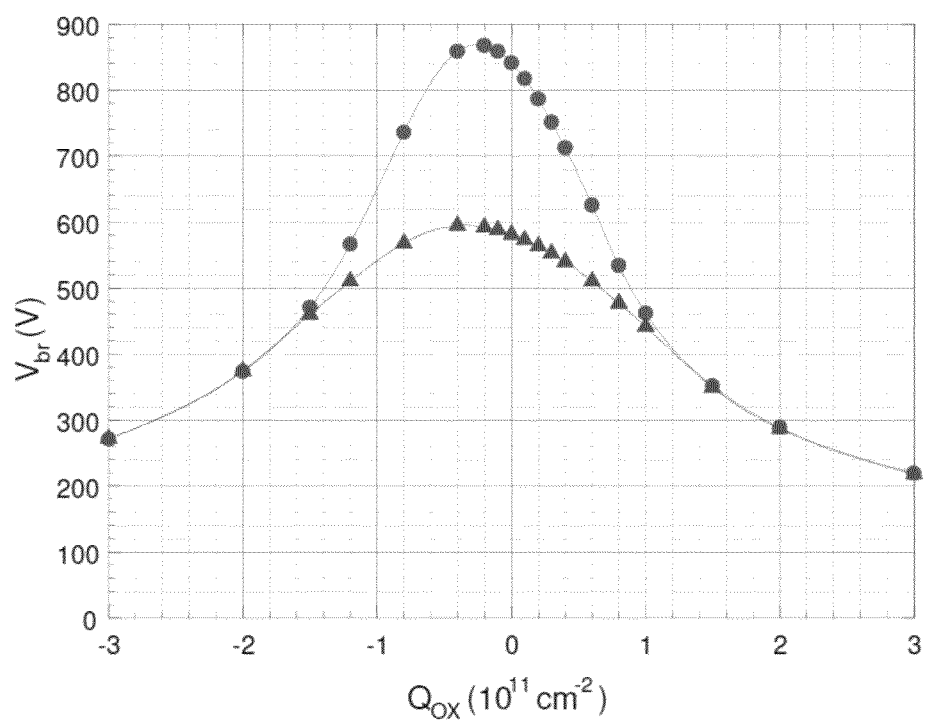
FIG. 36 shows the dependence of the breakdown voltage on the net charge of a dielectric of two high-voltage components according to one or more embodiments.

As can be deduced from the relationship represented in FIG. 36 between the breakdown voltage $V_{br}$ and the charge carrier density per area of the net charge $Q_{OX}$ of the accumulation oxide for two exemplary power TEDFETs with a pitch of the accumulation oxide of approximately 6 µm, these devices achieve a maximum breakdown voltage at approximately a negative net charge with a charge density per area and accumulation oxide—semiconductor interface of approximately $2\times 10^{10}/cm^2$ to approximately $4\times 10^{10}/cm^2$, while a donor base doping of approximately $1\times 10^{14}/cm^3$ was assumed in this example. With these numerical values, the lateral integral of the donor base doping, and consequently the charge per unit area in the semiconductor in the case of blocking, lie at approximately $6\times 10^{10}/cm^2$, opposite which are two accumulation oxide—semiconductor interfaces. The negative charge of the accumulation oxide compensates in the case of blocking the positive donor charge and leads to a net-reduced, in the ideal case intrinsic, amount of charge in the blocking semiconductor volume. The curves shown in FIG. 36 were numerically determined for an accumulation oxide with singly charged fixed charges for two different active thicknesses of devices, only the semiconductor volume having been taken into consideration, while ignoring any reduction of the blocking capability that is caused for example by a lateral edge termination. The curve with the triangles indicates the blocking capability for a thickness of the lowly doped drift zone of 33 µm, while the curve with the circles describes the blocking capability in the case of a thickness of the drift zone of 50 µm. The thicker the drift zone is chosen, the higher the maximum achievable blocking capability, but the more steeply it also falls with increasing net charge in the semiconductor, taking into consideration the fixed interfacial charges with respect to the accumulation oxide. In the example of FIG. 36, with a thickness of the drift zone and customary safety allowances, the guaranteed blocking capability of 600 V can be achieved for charges of the accumulation oxide between approximately $-1\times 10^{11}/cm^2$ and approximately $+8\times 10^{10}/cm^2$. For smaller thicknesses of the drift zone and/or higher required blocking capabilities, the permissible window of the net charge of the accumulation oxide is reduced.

Figure 37:
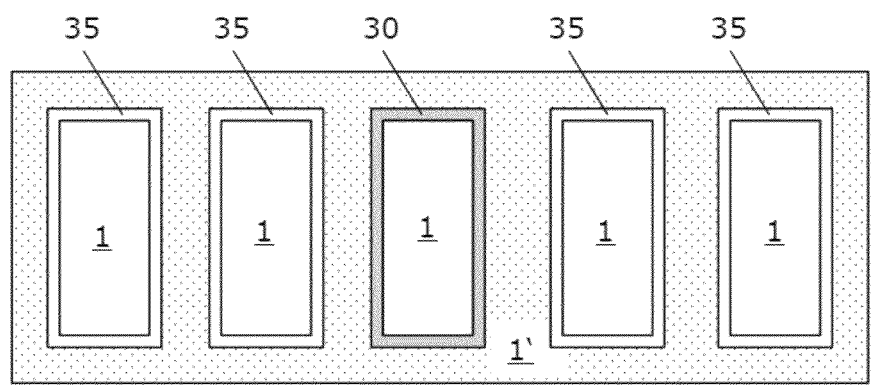
FIG. 37 schematically shows a horizontal cross section of a vertical semiconductor device according to one or more embodiments.

FIG. 37 shows an embodiment of a vertical semiconductor device 408 in a section of a horizontal cross section. The vertical semiconductor device 408 is typically a TEDFET. For example, the section shown in FIG. 37 may correspond to a central horizontal cross section through an active area of a TEDFET with a plurality of cells as represented in FIG. 21.

In the exemplary embodiment of FIG. 37 with five cells, five drift regions 1 are separated from a common drift control region 1' by accumulation oxides 30, 35 arranged in moat-shaped vertical trenches. In other embodiments, a plurality of drift control regions are separated from a common drift region 1 by corresponding accumulation oxides 30, 35. Depending on the specification, the semiconductor device 408 may have fewer or more than five cells.

According to one embodiment, only some of the accumulation oxides 30, 35 are in the form of a dielectric layer 30 with fixed negative charges. In the exemplary embodiment in FIG. 37, this is only the case for the central accumulation oxide 30 which typically has a negative net charge which can be set using atomic layer deposition processes. In the text below, the accumulation oxides 35 without and with a positive net charge are also referred to as further accumulation oxides 35 and further dielectric layers, respectively.

For manufacture using an atomic layer deposition cycle, for example with TMA as the precursor, singly charged negative charges are typically applied with a charge density per area of approximately $2 \cdot 10^{11}/cm^2$. However, in order to compensate for positive oxide charges, only a negative charge with a charge density of singly charged charges per area of only approximately $4 \ldots 6 \cdot 10^{10}/cm^2$ is often required. In order to achieve average compensation for generally positive dielectric charges of thermal oxides and the fixed negative dielectric charges of oxides or oxynitrides, which are doped with aluminum by means of atomic layer deposition, for the semiconductor device, the further accumulation oxides 35 are not doped with aluminum. The further accumulation oxides 35 are typically thermal oxides and therefore have a positive net charge. In other words, the vertical component 408 is typically a TEDFET having one or more dielectric layers 30 with a negative net charge as an accumulation oxide and one or more further dielectric layers 35 with a positive net charge as an accumulation oxide. As a result, the average net charge may be very finely set and compensated for, for example.

Only some of the vertical trenches, for example approximately every third to fifth vertical trench, preferably approximately every fourth vertical trench, typically has a dielectric layer 30 with a negative net charge, while the other vertical trenches each have a dielectric layer 35 with a positive net charge, for example a thermal oxide. A mean net charge per unit area for undoped thermal oxides of approximately $5 \cdot 10^{10}$ elementary charges per $cm^2$ was determined using experiments. The net charge per unit area of aluminum-doped thermal oxides, which are manufactured using an atomic layer deposition cycle with TMA as the precursor, is approximately $-2 \cdot 10^{11}$ elementary charges per $cm^2$. Good charge compensation for this numerical example is thus achieved by a ratio of the total area of the dielectric layer 30 with a negative net charge to the total area of the further dielectric layer 35 with a positive net charge of approximately 1:3 to 1:5. With a changed positive and/or negative area charge density of the oxides, other compensation ratios naturally accordingly result, that is to say a correspondingly higher or lower proportion of the accumulation oxides with a negative oxide charge.

In other embodiments, a dielectric layer 30 with a negative net charge is respectively arranged in each of the vertical trenches. The resultant area charge in the semiconductor can therefore also be readily compensated for in the off state with a higher donor basic doping of more than $1 \cdot 10^{14}/cm^2$, for example.

It goes without saying that oxide regions with a different net charge can also be used for charge compensation in vertical trenches. This is explained with reference to the following FIG. 38.

Figure 38:
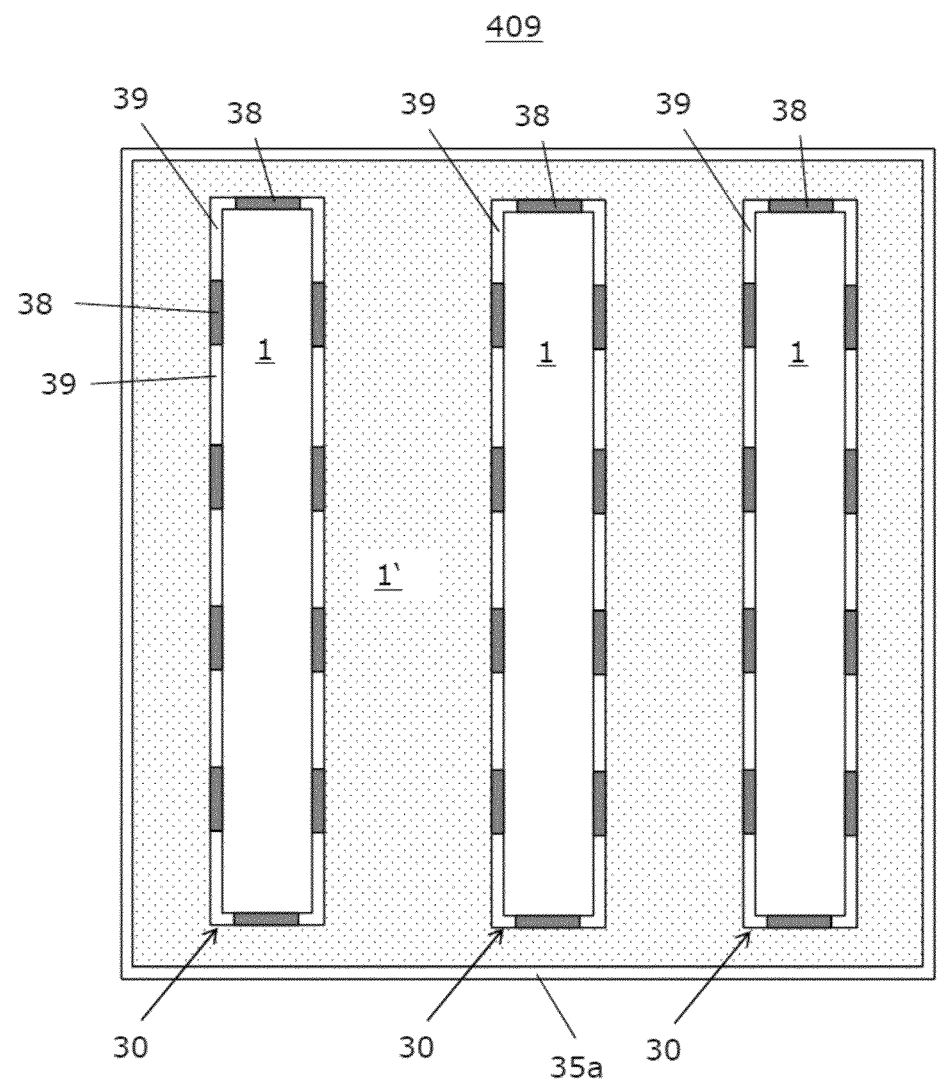
FIG. 38 schematically shows a horizontal cross section of a vertical semiconductor device according to one or more embodiments.

FIG. 38 shows an embodiment of a vertical semiconductor device 409 in an excerpt of a horizontal cross section. The vertical semiconductor device 409 is likewise typically a TEDFET. Three cells are shown in the exemplary embodiment in FIG. 38. The drift regions 1 are separated from a common drift control region 1' by dielectric layers 30 which are arranged in moat-shaped vertical trenches and act as accumulation oxides. In other embodiments, a plurality of drift control regions are separated from a common drift region 1 by corresponding dielectric layers 30. The dielectric layers 30 consist of portions 38 with a negative net charge, for example aluminum-doped oxides or oxynitrides, and portions 39 with a positive net charge, for example undoped thermal oxides or cesium-doped oxides or oxynitrides.

The area ratio of the portions 38 and 39 is typically in a range of approximately 3 to approximately 5 in order to ensure good charge compensation.

The common drift control region 1' is typically surrounded by a dielectric region 35a which is arranged in a further circumferential vertical trench. As a result, the common drift control region 1' is dielectrically insulated from adjoining semiconductor regions in the horizontal direction, and charge carriers are thus prevented from flowing out of the common drift control region 1'. The dielectric region 35a may be formed by a thermally produced silicon oxide, for example. It goes without saying that such a dielectric region 35a may also be provided for the semiconductor device 408 illustrated in FIG. 37.

As an alternative to a fixed grid of the accumulation oxides or accumulation oxide portions with a positive and negative net charge, the grid may also vary over the chip area, for example in order to achieve finer compensation for the total charge. For example, a TEDFET may have an alternating grid of 3 and accumulation oxides with a positive oxide charge, each with an accumulation oxide with a negative oxide charge.

As an alternative to uniformly arranging the accumulation oxides or accumulation oxide portions with a positive and negative net charge over the chip, that is to say uniform charge compensation, the density of the accumulation oxides or accumulation oxide portions with a negative oxide charge and/or the absolute net charge thereof may be increased, for example in the direction of the edge termination and/or toward a gate path, an electrode supply conductor and/or a semiconductor region having a peripheral component, in order to statically set a higher blocking capability there, in particular, while a positive integral net charge of the accumulation oxides or accumulation oxide portions is set in the rest of the cell array, and the robustness of the component during breakdown can thus be increased.

Figure 39:
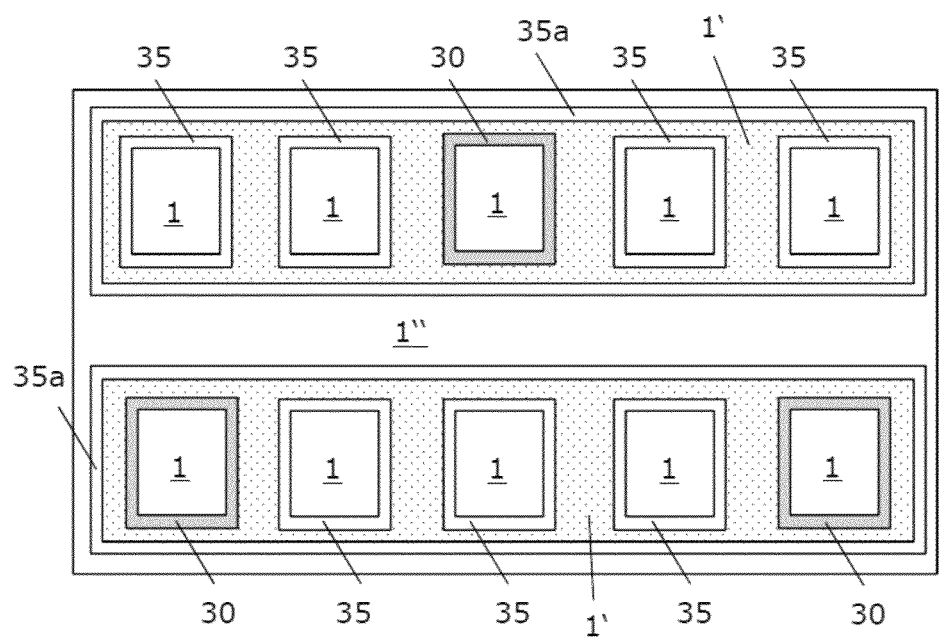
FIG. 39 schematically shows a horizontal cross section of a vertical semiconductor device according to one or more embodiments.

FIG. 39 shows an embodiment of a vertical semiconductor device 410 in an excerpt of a horizontal cross section. The vertical semiconductor device 410 is likewise typically a TEDFET. Two cell regions are shown in the exemplary embodiment in FIG. 39. In each of the two cell regions, a plurality of drift regions 1 are separated from a common drift control region 1' by dielectric layers 30, 35 which are arranged in moat-shaped vertical trenches and act as accumulation oxides. In other embodiments, a plurality of drift control regions 1' are separated from a common drift region 1 in each of the two cell regions by corresponding dielectric layers 30, 35.

According to the exemplary embodiment shown, the two cell regions differ in terms of the number and arrangement of the dielectric layer or layers 30 with fixed negative charges. In other exemplary embodiments, the number and/or arrangement of the dielectric layers 30 with fixed negative charges is/are identical in the cell regions.

Each of the drift control regions 1' is typically surrounded by a dielectric region 35a arranged in a respective further circumferential vertical trench in order to insulate the drift control regions 1' from an adjoining semiconductor region 1".

The dielectric layers 30 typically have a negative net charge and the dielectric layers 35 typically have a positive net charge. A resultant area charge in the semiconductor can be readily compensated for in the off state by suitably specifying the net charges and/or the distribution of the dielectric layers 30, 35.

Figure 40:
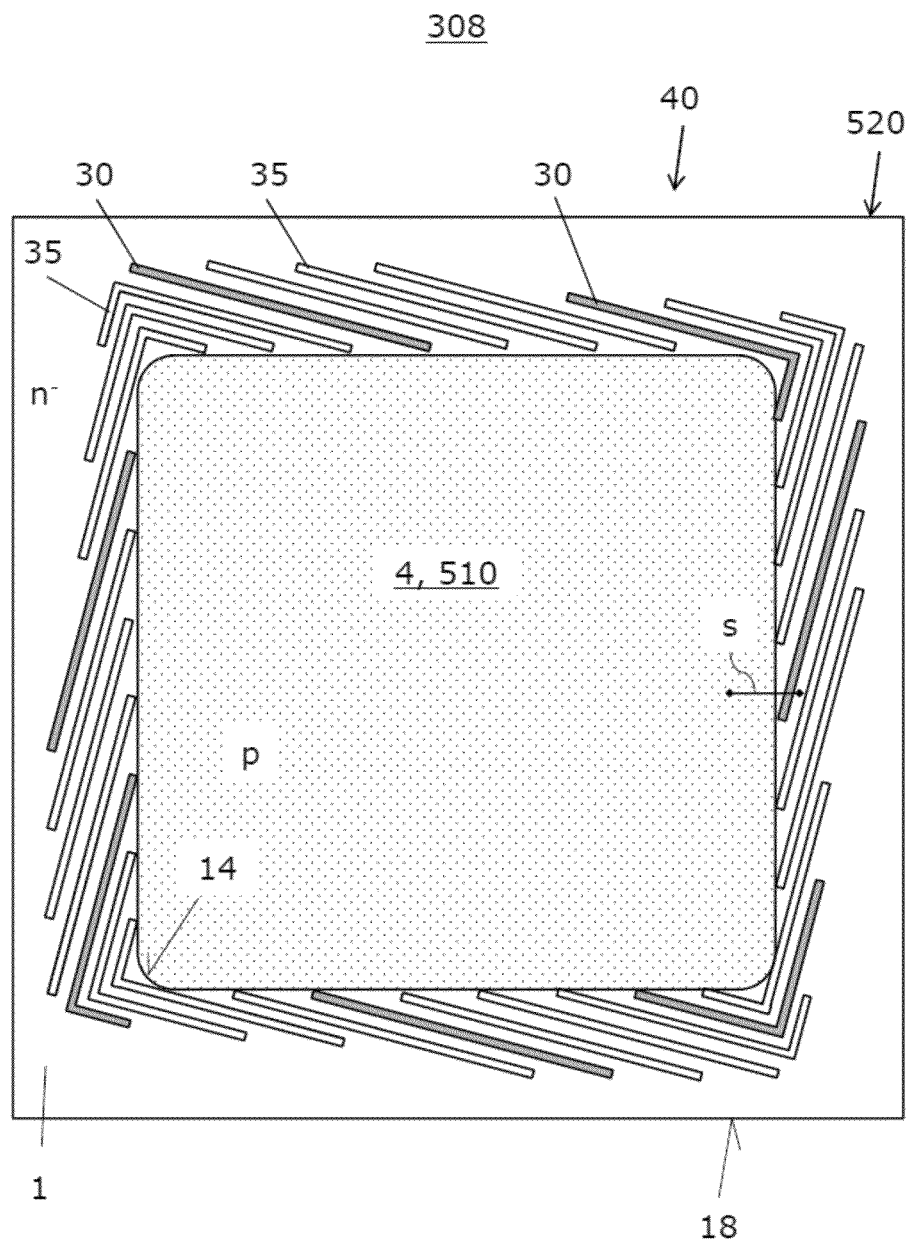
FIG. 40 schematically shows a plan view of a vertical semiconductor device according to one or more embodiments.

FIG. 40 shows a plan view of an embodiment of a vertical semiconductor device 308. The semiconductor device 308 includes a semiconductor body 40 having a horizontal main surface which extends as far as an outer edge 18. The semiconductor body 40 includes an active area 510 and a peripheral area 520 which both extend as far as the horizontal main surface. FIG. 40 corresponds to a plan view of the horizontal main surface. For reasons of clarity, metallizations and possible cell structures of the active area 510 are not illustrated. An n-type semiconductor layer 1 is embedded in the semiconductor body 40 and extends as far as the horizontal main surface in the peripheral area 520. In the active area 510, a pn junction 14 is arranged between the n-type semiconductor layer 1 and the horizontal main surface. The pn junction 14 typically extends as far as the horizontal main surface in a transition region between the active area 510 and the peripheral area 520. In the peripheral area 520, a plurality of vertical trenches surround the active area 510 and the pn junction 14. The vertical trenches extend from the horizontal main surface into the semiconductor body 40. The vertical trenches typically extend to a vertical depth which is greater than the maximum depth of the pn junction 14 in the active area 510. One or more vertical trenches have a dielectric layer 30 with fixed negative charges. The dielectric layer 30 with fixed negative charges may be located on at least one side wall of the respective vertical trenches or may completely fill the latter. This provides an edge termination having a small horizontal space requirement.

The active area 510 may be a cell array, for example an array of TEDFET cells, as explained with reference to FIG. 21, MOSFET cells or IGBT cells, but may also be a p-doped anode region 4 of a diode. In the latter case, a vertical section along the line 's' typically corresponds to a structure which is similar to the semiconductor structure shown in FIG. 20, but typically without the dielectric covering 84 there. In addition, depending on the position of the line 's', the dielectric layer 30 with fixed negative charges and the anode region 4 are spaced apart from one another since the trench and the active area 510 typically form an acute angle. One end of the dielectric layers 30 and/or 35 may extend into the anode region 4, may touch the latter or else may comply with a minimum distance from the anode region. The cavities 83 shown in FIG. 20 are also only optional for the semiconductor device 308.

The vertical trenches of the semiconductor device 308 are typically in the form of elongated rectangles in horizontal sections or in the plan view shown and are typically L-shaped or substantially L-shaped in corner regions of the active area 510, with the result that at least one portion of the vertical trenches forms an acute angle with the active area 510 and/or the closest outer edge 18.

In addition, further dielectric layers 35 with a positive net charge are typically arranged in some of the vertical trenches. Each second to seventh vertical trench in the peripheral area is typically at least partially filled with a dielectric layer 30 with a negative net charge, while the other vertical trenches are at least partially filled with a further dielectric layer 35 with a positive net charge. In a similar manner to that explained with reference to FIGS. 37 to 39, accurate charge compensation is thus also enabled for edge termination structures. In this case, different regions of the peripheral area may also be formed with a different thickness of the dielectric layers 30 with a negative net charge. In this case, the corners and/or the L-shaped regions may have a different thickness, for example a smaller thickness of the dielectric layers 30 with a negative net charge, from the straight regions of the peripheral area. The edge termination structure of the semiconductor device 308 typically consists of a multiplicity of vertical trenches which are completely or partially filled with dielectric, in particular oxide, with the result that the active area 510 is completely surrounded by the oxide-filled vertical trenches.

In other embodiments, a dielectric layer 30 with a negative net charge is respectively arranged in each of the vertical trenches of the semiconductor device 308.

It goes without saying that, for good integral charge compensation, the area charge density of the fixed negative charges of the dielectric layers 30 with a negative net charge is typically adapted both to the donor basic doping of the adjoining semiconductor regions and to the area charge density of the positive charges of the dielectric layers 30, 35 expected according to the manufacturing conditions. For example, the area charge density of the fixed negative charges of the dielectric layers 30 in the peripheral area 520 may be selected to be greater than for corresponding dielectric layers with a negative net charge in the active area 510 if the latter were manufactured in more favorable conditions.

The semiconductor devices 308 and 408 to 410 explained with reference to FIGS. 37 to 40 may be manufactured as explained with reference to FIGS. 22 to 35, regions of the vertical trenches and/or some of the vertical trenches being completely masked before the atomic layer deposition. This results in dielectric layers 30 or portions 38 of dielectric layers 30 with a negative net charge and further dielectric layers 35 or remaining portions 39 of dielectric layers 30 with a positive net charge. This enables very finely controlled global or integral compensation for the charge of the dielectric layers 30, 35.

For example, some of the vertical trenches are completely covered with a mask before the atomic layer deposition, while other, adjacent vertical trenches lie completely open. This may be achieved by means of a conventional hard mask, or else by means of non-conformal deposition of carbon on the wafer front side (main surface) in order to form a carbon mask. The atomic layer deposition on the unmasked vertical trenches, which is now carried out, is typically carried out on a thin starting oxide which was chemically or thermally produced. The carbon mask or the conventional hard mask can then be removed again. In comparison with a conventional hard mask, for example of a deposited oxide, the carbon mask can be easily removed by means of incineration following the atomic layer deposition of aluminum or TMA in the open vertical trenches and before thermal oxidation. Aluminum possibly remaining on the wafer front side does not have a significant effect on the device properties since the dopings on the semiconductor surface are sufficiently high to be significantly influenced by the relatively small absolute area density of the aluminum doping in the region of approximately $2.5 \cdot 10^{11}/cm^2$.

After the carbon mask has been incinerated or after the hard mask has been removed, partial thermal oxidation typically takes place. At the end of this process, the oxidation regions grow toward one another and thus also close the original vertical trench(es). However, a buried cavity which possibly remains and/or a buried seam line which possibly remains in the oxide does/do not impair the device function. In the horizontal direction, the thickness of the seam line is sufficiently low, typically less than a few nm, with the result that there is no significant reduction in the accumulation, that is to say impairment of the on resistance, and the blocking behavior is not impaired in the vertical direction with the high aspect ratios of the vertical trenches of typically more than 50 because no avalanche-like ionization can take place in the seam line.

At least the end of the partial oxidation typically takes place at high temperatures in the range of 1150° C. to 1250° C., for example. This makes it possible to reduce or even entirely prevent wafer bending since the oxide is sufficiently soft at these high temperatures and the oxide surfaces which meet one another can therefore fuse with one another with low tension.

In other embodiments, moist oxidations and/or a sequential sequence of moist and dry oxidations are used for the partial oxidation. On account of their low viscosity, moist oxides can be readily combined with dry oxides of a comparable layer homogeneity and quality at high temperatures.

According to another embodiment, further positive fixed charges are deliberately incorporated in the further dielectric layers 35 or remaining portions of dielectric layers 30 with a positive net charge using a further atomic layer deposition. For example, the positive net charge may be set by doping with cesium. This enables even finer charge compensation. In addition, regions with an increased negative oxide charge, for example in the form of Al-doped silicon oxide, regions with an increased positive oxide charge, for example in the form of Cs-doped silicon oxide, and regions without deliberate influencing of the net charge can be integrated in a semiconductor device, for example in different vertical trenches or trench portions, by means of doping, for example in the form of an undoped thermal oxide. Additional corresponding masks are required for manufacture in this case. In this case, the partial oxidation may also be carried out in a common process.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, the method comprising:
   providing a semiconductor body which comprises a main surface and a first n-type semiconductor region;
   forming a trench which extends from the main surface into the first n-type semiconductor region; and
   forming a dielectric layer comprising fixed negative charges on a surface of the trench, comprising performing at least one atomic layer deposition using an organometallic precursor.

2. The method of claim 1, wherein a monolayer of metal organyls is formed by the atomic layer deposition.

3. The method of claim 1, wherein performing the at least one atomic layer deposition further comprises cleaving of ligands of the organometallic precursor.

4. The method of claim 1, further comprising forming a metal-doped silicon oxide layer.

5. The method of claim 1, wherein an aluminum organyl is used as the organometallic precursor.

6. The method of claim 1, wherein trimethyl aluminum is used as the organometallic precursor.

7. The method of claim 1, further comprising forming a starting oxide layer on the surface of the trench prior to performing the at least one atomic layer deposition.

8. The method of claim 1, wherein a charge carrier density per area of the fixed negative charges of the dielectric layer decreases step-wise or continuously with increasing distance from the main surface.

9. The method of claim 1, further comprising partially masking the trench prior to performing the at least one atomic layer deposition.

10. The method of claim 1, wherein the dielectric layer is formed such that the dielectric layer has a negative positive net charge, the method further comprising:
    forming at least one further trench which extends from the main surface into the semiconductor body; and
    forming on a surface of the at least one further trench a further dielectric layer having a positive net charge.

* * * * *